(12) United States Patent
Cho et al.

(10) Patent No.: US 10,991,600 B2
(45) Date of Patent: Apr. 27, 2021

(54) PROCESS CHAMBER AND SUBSTRATE PROCESSING APPARATUS INCLUDING THE SAME

(71) Applicant: Samsung Electronics Co., Ltd., Suwon-si (KR)

(72) Inventors: Yong-Jhin Cho, Hwaseong-si (KR); Young-Hoo Kim, Yongin-si (KR); Jihoon Jeong, Suwon-si (KR); Yungjun Kim, Seoul (KR); Jung-Min Oh, Incheon (KR); Kuntack Lee, Suwon-si (KR); Hyosan Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 326 days.

(21) Appl. No.: 15/848,481

(22) Filed: Dec. 20, 2017

(65) Prior Publication Data

US 2018/0366349 A1   Dec. 20, 2018

(30) Foreign Application Priority Data

Jun. 19, 2017   (KR) .................. 10-2017-0077426

(51) Int. Cl.
*H01L 21/67* (2006.01)
*H01L 21/02* (2006.01)

(52) U.S. Cl.
CPC .. *H01L 21/67034* (2013.01); *H01L 21/02057* (2013.01); *H01L 21/6719* (2013.01); *H01L 21/67126* (2013.01); *H01L 21/67178* (2013.01); *H01L 21/67201* (2013.01)

(58) Field of Classification Search
CPC ......... H01L 21/67178; H01L 21/02057; H01L 21/6719; H01L 21/67034; H01L 21/67126; H01L 21/67201
See application file for complete search history.

(56) References Cited

U.S. PATENT DOCUMENTS

| | | | |
|---|---|---|---|
| 6,440,178 B2 * | 8/2002 | Berner | H01L 21/67173 29/25.01 |
| 6,672,820 B1 * | 1/2004 | Hanson | C25D 7/12 414/222.06 |
| 8,124,907 B2 | 2/2012 | Lee et al. | |
| 2014/0087518 A1 | 3/2014 | Ode et al. | |

FOREIGN PATENT DOCUMENTS

| | | |
|---|---|---|
| JP | 2009124041 | 6/2009 |
| KR | 101267884 | 5/2013 |
| KR | 1020130056758 | 5/2013 |
| KR | 101484553 | 1/2015 |
| KR | 101610644 | 4/2016 |

* cited by examiner

*Primary Examiner* — Benjamin L Osterhout
(74) *Attorney, Agent, or Firm* — Myers Bigel, P.A.

(57) ABSTRACT

A process chamber and a substrate processing apparatus including the same are disclosed. The process chamber includes a first housing and a second housing on the first housing. The first housing includes a first outer wall, a first partition wall facing the first outer wall, and a first side wall connecting the first outer wall and the first partition wall. The second housing includes a second outer wall, a second partition wall between the second outer wall and the first partition wall, and a second side wall connecting the second outer wall and the second partition wall. Each of the first and second outer walls has a thickness greater than a thickness of the first partition wall and a thickness of the second partition wall.

20 Claims, 22 Drawing Sheets

PROCESS CHAMBER AND SUBSTRATE PROCESSING APPARATUS INCLUDING THE SAME

CROSS-REFERENCE TO RELATED APPLICATIONS

This U.S. nonprovisional patent application claims priority under 35 U.S.C § 119 from Korean Patent Application No. 10-2017-0077426, filed on Jun. 19, 2017, the entire contents of which are hereby incorporated by reference.

BACKGROUND

The present inventive concepts relate to a process chamber and a substrate processing apparatus including the same.

A semiconductor manufacturing process may include a deposition process, an etching process, a cleaning process, etc. The cleaning process may remove contaminants remaining on a substrate. The cleaning process may include a chemical process that supplies a chemical to remove contaminants on a substrate, a rinsing process that supplies a cleaning solution to remove the chemical on the substrate, and a drying process that dries the remaining cleaning solution on the substrate. The chemical process, the rinsing process, and the drying process may be sequentially performed.

In the drying process, a process chamber is supplied with a supercritical fluid to dry the cleaning solution remaining on the substrate. When the drying process is performed, the process chamber may have a high inner pressure caused by the supercritical fluid. Therefore, much research has recently been conducted on structures of the process chamber capable of enduring the high pressure.

SUMMARY

Some embodiments of the present inventive concepts provide a compact-sized process chamber capable of enduring high pressure while having a plurality of compartment spaces and a substrate processing apparatus including the same.

Some embodiments of the present inventive concepts provide a process chamber and a substrate processing apparatus including the same in which processing efficiency is enhanced.

Objects of the present inventive concepts are not limited to the above-mentioned ones, and other objects which have not been mentioned above will be clearly understood to those skilled in the art from the following description.

According to example embodiments of the present inventive concepts, a process chamber may include: a first housing; and a second housing on the first housing. The first housing may include: a first outer wall; a first partition wall facing the first outer wall; and a first side wall connecting the first outer wall and the first partition wall. The second housing may include: a second outer wall; a second partition wall between the second outer wall and the first partition wall; and a second side wall connecting the second outer wall and the second partition wall. Each of the first and second outer walls may have a thickness greater than a thickness of the first partition wall and a thickness of the second partition wall.

According to example embodiments of the present inventive concepts, a process chamber may include: a housing having an inner space; and at least one partition wall in the housing and dividing the inner space into a plurality of compartment spaces. The housing may include: a first outer wall below the at least one partition wall; a second outer wall above the at least one partition wall; and a side wall between the first and second outer walls and connected to the at least one partition wall. Each of the first and second outer walls may have a thickness greater than a thickness of the at least one partition wall.

According to example embodiments of the present inventive concepts, a process chamber may include: a housing having a plurality of compartment spaces separated from each other; a first support wall below the housing; and a second support wall above the housing. The housing may include: a lower wall in contact with the first support wall; an upper wall between the lower wall and the second support wall and in contact with the second support wall; a side wall connecting the lower wall and the upper wall to each other; and a partition wall between the lower wall and the upper wall and connected to the side wall. The partition wall may have a thickness less than a sum of thicknesses of the first support wall and the lower wall and less than a sum of thicknesses of the second support wall and the upper wall.

According to example embodiments of the present inventive concepts, a substrate processing apparatus may include: a process chamber including a first housing having a first inner space and a second housing having a second inner space, the second housing being stacked on the first housing; a first substrate support member in the first inner space and configured to support a substrate; a second substrate support member in the second inner space and configured to support a substrate; a fluid supply configured to supply a fluid into the first and second inner spaces; and a fluid exhaust configured to exhaust a fluid from the first and second inner spaces. The first housing may include: a first outer wall; a first partition wall facing the first outer wall; and a first side wall connecting the first outer wall and the first partition wall. The second housing may include: a second outer wall; a second partition wall between the second outer wall and the first partition wall; and a second side wall connecting the second outer wall and the second partition wall. Each of the first and second partition walls may have a thickness less than a thickness of the first outer wall and a thickness of the second outer wall.

Details of other example embodiments are included in the description and drawings.

DETAILED DESCRIPTION OF EMBODIMENTS

It will be herein discussed in detail the present inventive concepts and their example embodiments with reference to the accompanying drawings.

Figure 1:
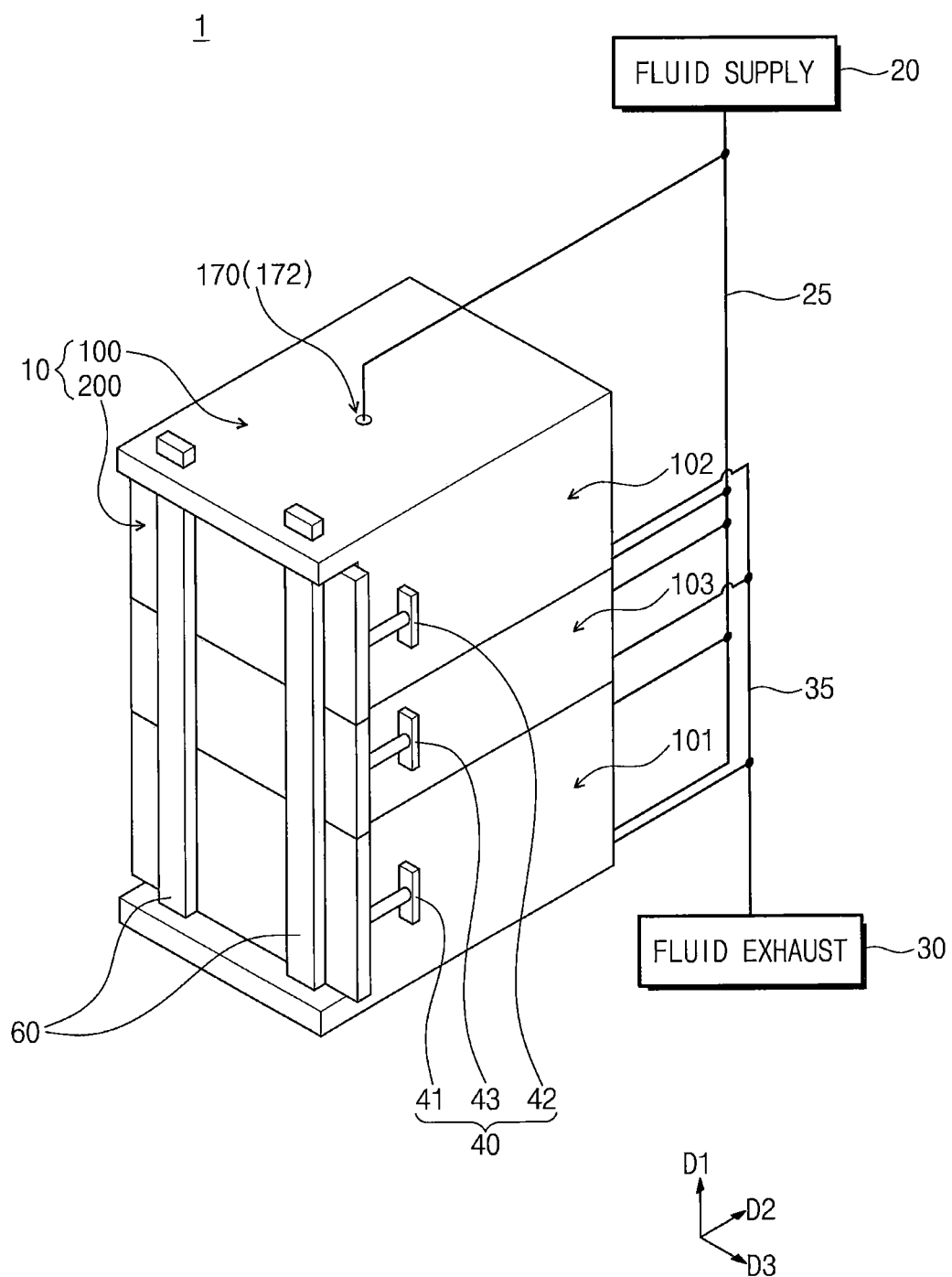
FIG. 1 illustrates a simplified perspective view showing a substrate processing apparatus according to example embodiments of the present inventive concepts.
Figure 2:
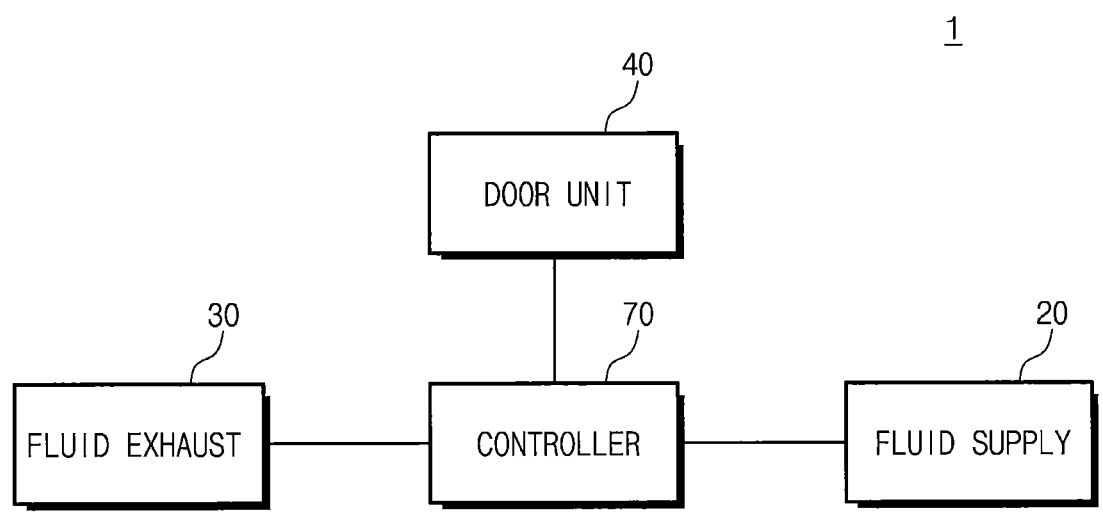
FIG. 2 illustrates a block diagram partly showing the substrate processing apparatus of FIG. 1.
Figure 3:
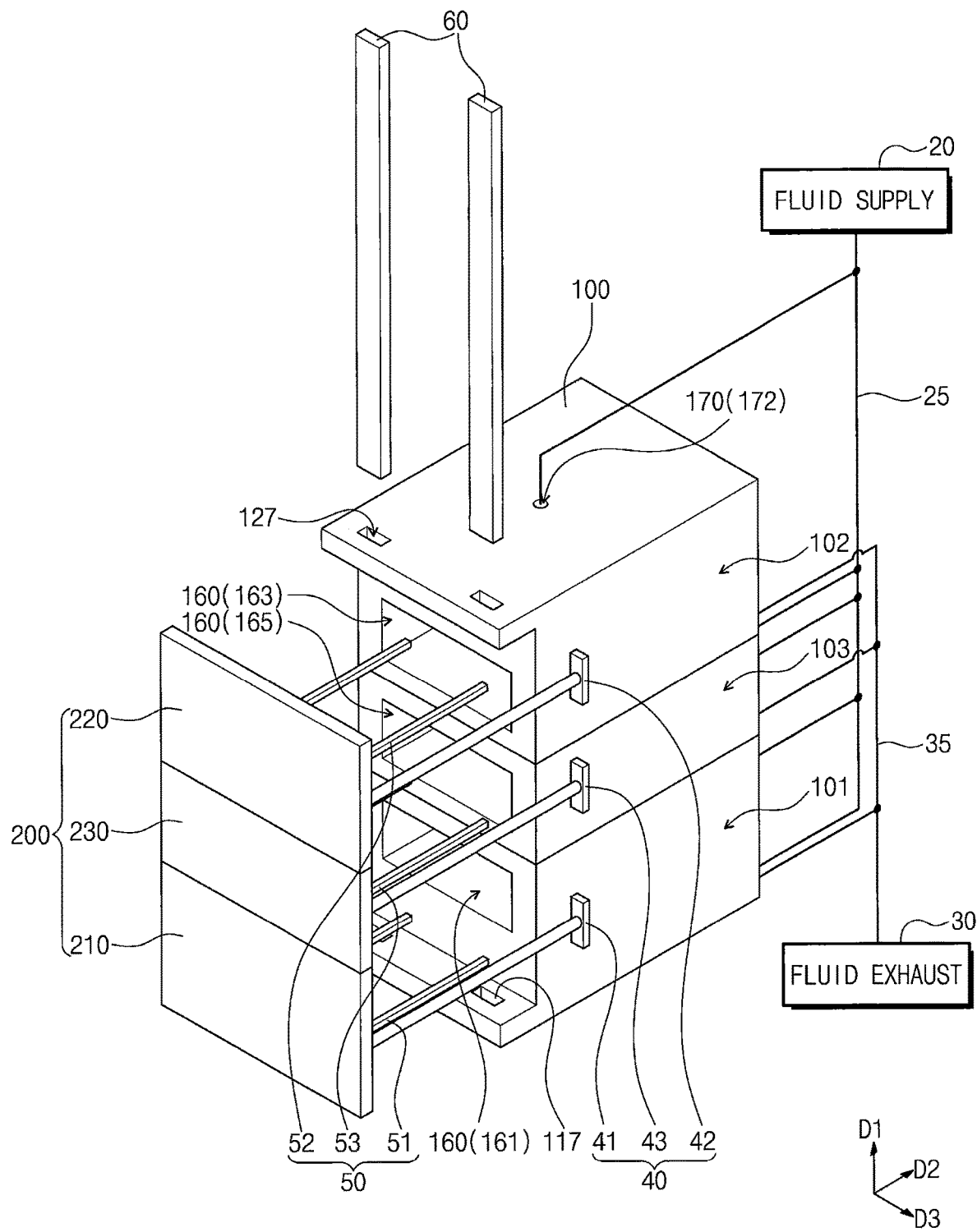
FIG. 3 illustrates a simplified exploded perspective view partly showing that some components may be structurally separated from the substrate processing apparatus of FIG. 1.

FIG. 1 illustrates a simplified perspective view showing a substrate processing apparatus according to example embodiments of the present inventive concepts. FIG. 2 illustrates a block diagram partly showing the substrate processing apparatus of FIG. 1. FIG. 3 illustrates a simplified exploded perspective view partly showing that some components may be structurally separated from the substrate processing apparatus of FIG. 1.

Referring to FIGS. 1 to 3, a substrate processing apparatus 1 according to example embodiments of the present inventive concepts may use a supercritical fluid to perform substrate treatment processes such as a drying process, a cleaning process, and an etching process. In an embodiment, the substrate processing apparatus 1 may perform a drying process in which a supercritical fluid is employed to dry a substrate. The supercritical fluid may dry the substrate by dissolving an organic solvent remaining on the substrate. It will be hereinafter described an example in which the substrate processing apparatus 1 performs a substrate drying process.

The substrate processing apparatus 1 may include a process chamber 10, a fluid supply or fluid supply system 20, and a fluid exhaust or fluid exhaust system 30. The substrate processing apparatus 1 may further include a door or door unit 40, a fixing member 60, a substrate support 50, and a controller 70.

The process chamber 10 may provide a plurality of compartment spaces where the substrate drying process is performed. The plurality of compartment spaces may be separated from each other. The process chamber 10 may include a plurality of entrances 160 that penetrate therethrough. For example, the entrances 160 may include first to third entrances 161, 162, and 163. Each of the entrances 160 may be correspondingly connected to one of the compartment spaces. In this configuration, a substrate (see W of FIG. 4) may be positioned or received through the entrances 160 into each of the compartment spaces. The process chamber 10 may include a housing assembly 100 and a shield assembly 200. The housing assembly 100 may include a first housing 101, a second housing 102, and at least one third housing 103. The first housing 101, the third housing 103, and the second housing 102 may be sequentially stacked along a first direction D1. The first direction D1 may be vertical or parallel to an up-and-down direction. The process chamber 10 will be further discussed in detail below with reference to FIGS. 4 to 7.

The fluid supply 20 may be connected to the process chamber 10. For example, the fluid supply 20 may be connected through a supply line 25 to the first housing 101, the second housing 102, and the third housing 103. In an embodiment, the supply line 25 may be connected to supply holes or passageways 170 and lower supply holes or passageways (see 175 of FIG. 4) which will be discussed below. The fluid supply 20 may supply a fluid to the compartment spaces (see S1, S2, and S3 of FIG. 4). The fluid may be in a supercritical state. The term "a supercritical state" may denote that a material reaches a critical state in which its temperature and pressure are equal to or greater than a critical point, and thus there is no distinction between gaseous and liquid phases. A material in the supercritical state may have a molecular density similar to that of liquid and have viscosity similar to that of gas. Due to its extremely high diffusion, penetration, and dissolution, the supercritical material may have an advantage of chemical reaction. In addition, since the supercritical material may have an extremely low surface tension insufficient to exert an interface tension on a fine structure, the supercritical material may prevent pattern collapse and have superior drying efficiency, thereby being useful for drying semiconductor devices.

The supercritical fluid may include carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), hexafluoride ($SF_6$), acetone ($C_3H_8O$), or a combination thereof. It will be described hereinafter some embodiments in which carbon dioxide ($CO_2$) is chiefly used as the supercritical fluid for the substrate drying process, but constituents and kinds of supercritical fluids are not limited thereto. When carbon dioxide is at more than about 30° C. and under more than about 7.4 MPa, the carbon dioxide may reach its supercritical state. Accordingly, it may be required that the process chamber 10 should be made of a material capable of enduring critical temperature and pressure of the supercritical fluid. For example, the process chamber 10 may be made of stainless.

The fluid exhaust 30 may be connected to the process chamber 10. For example, the fluid exhaust 30 may be connected through an exhaust line 35 to the first housing 101, the second housing 102, and the third housing 103. The fluid exhaust 30 may discharge fluids out from the compartment spaces of the process chamber 10. In an embodiment, the exhaust line 35 may be connected to exhaust holes or passageways 180 which will be discussed below.

The door unit 40 may be engaged with the shield assembly 200 to open and close (expose and cover) the entrances 160 of the process chamber 10. The door unit 40 will be further discussed in detail below.

The fixing member 60 may fixedly hold the shield assembly 200 that closes the entrances 160. For example, when pressures of the compartment spaces (see S1, S2, and S3 of FIG. 4) are exerted on the shield assembly 200, the fixing member 60 may prevent the shield assembly 200 from moving due to the pressures of the compartment spaces S1, S2, and S3. The substrate support 50 may support the substrate W. In an embodiment, the substrate support 50 may be installed on the shield assembly 200. In other embodiments, the substrate support 50 may be installed on the housing assembly 100. The controller 70 may control operations of the fluid supply 20, the fluid exhaust 30, and the door unit 40.

Figure 4:
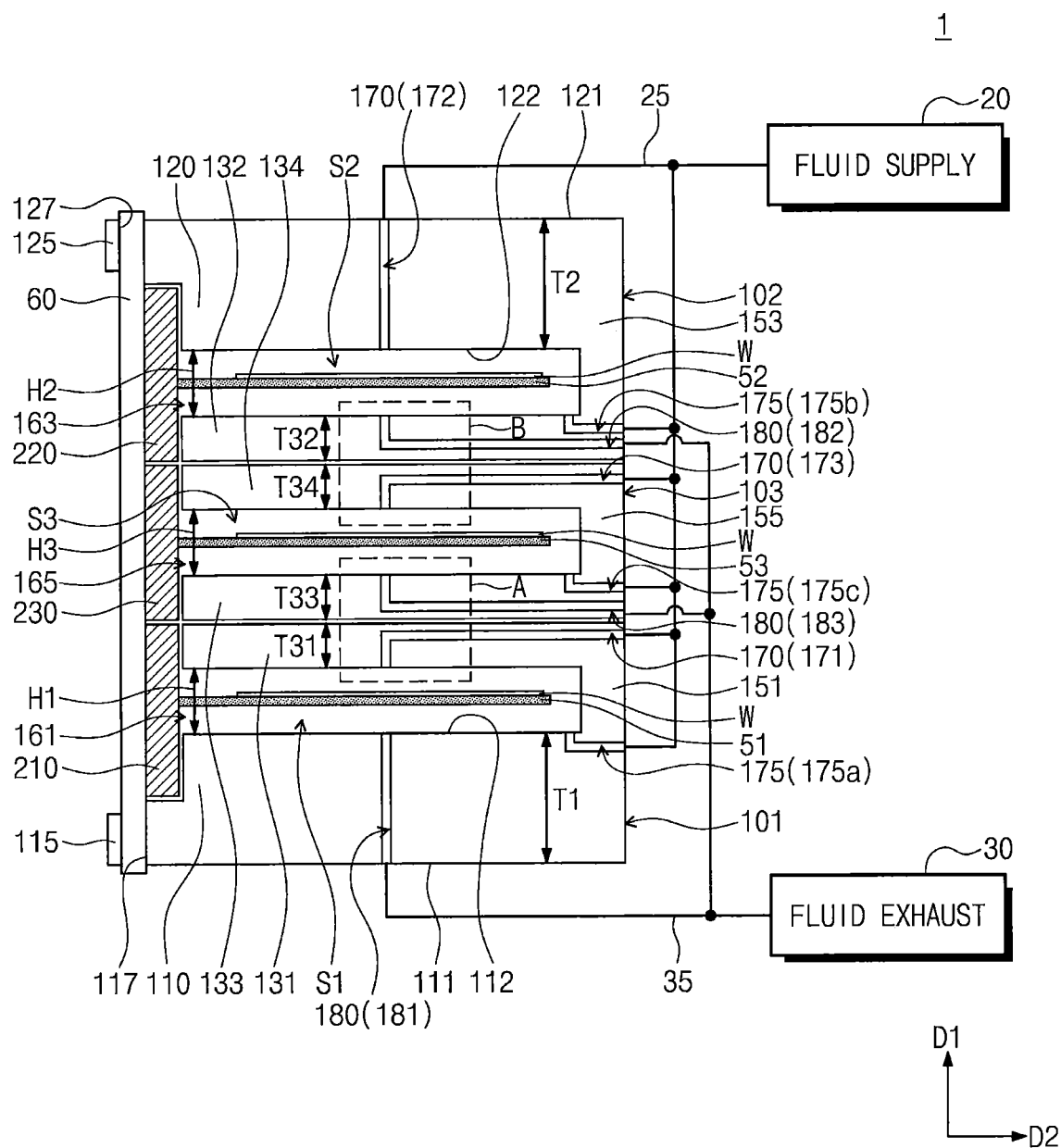
FIG. 4 illustrates a simplified longitudinal sectional view showing the substrate processing apparatus of FIG. 1.
Figure 5:
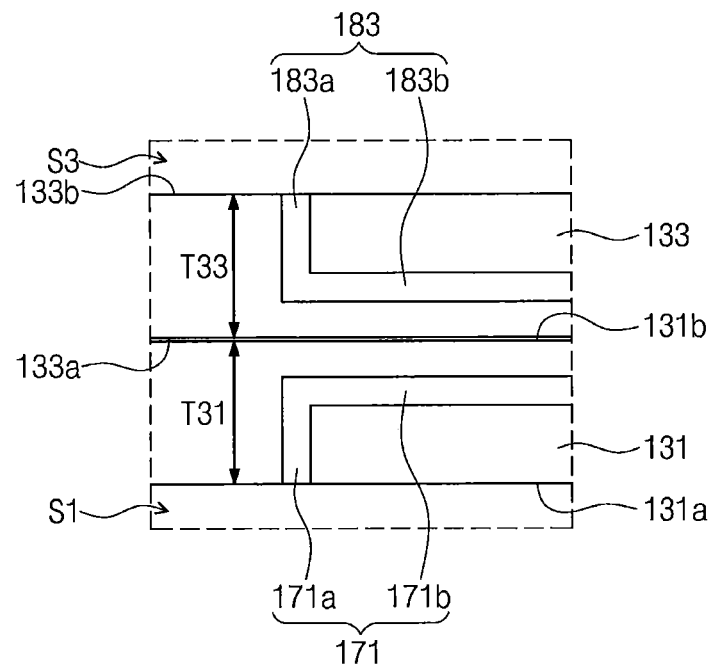
FIG. 5 illustrates an enlarged view showing section A of FIG. 4.
Figure 6:
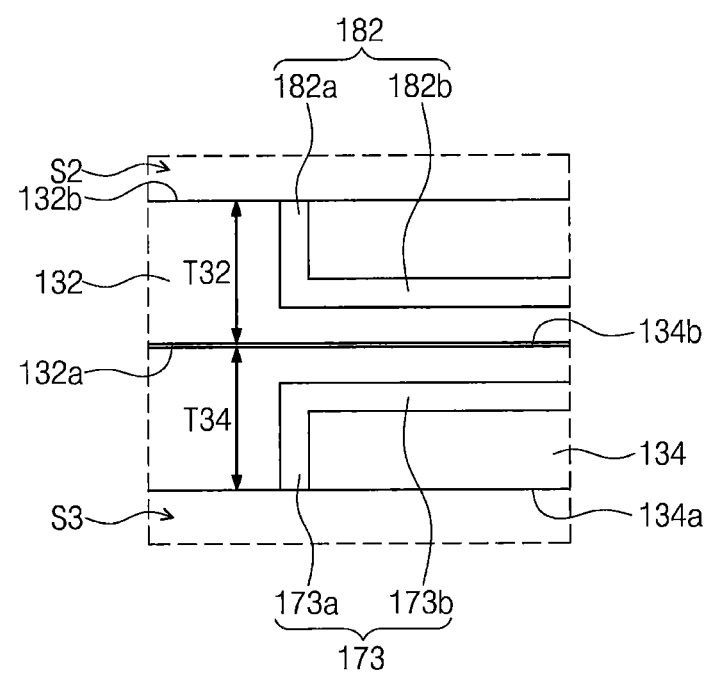
FIG. 6 illustrates an enlarged view showing section B of FIG. 4.
Figure 7:
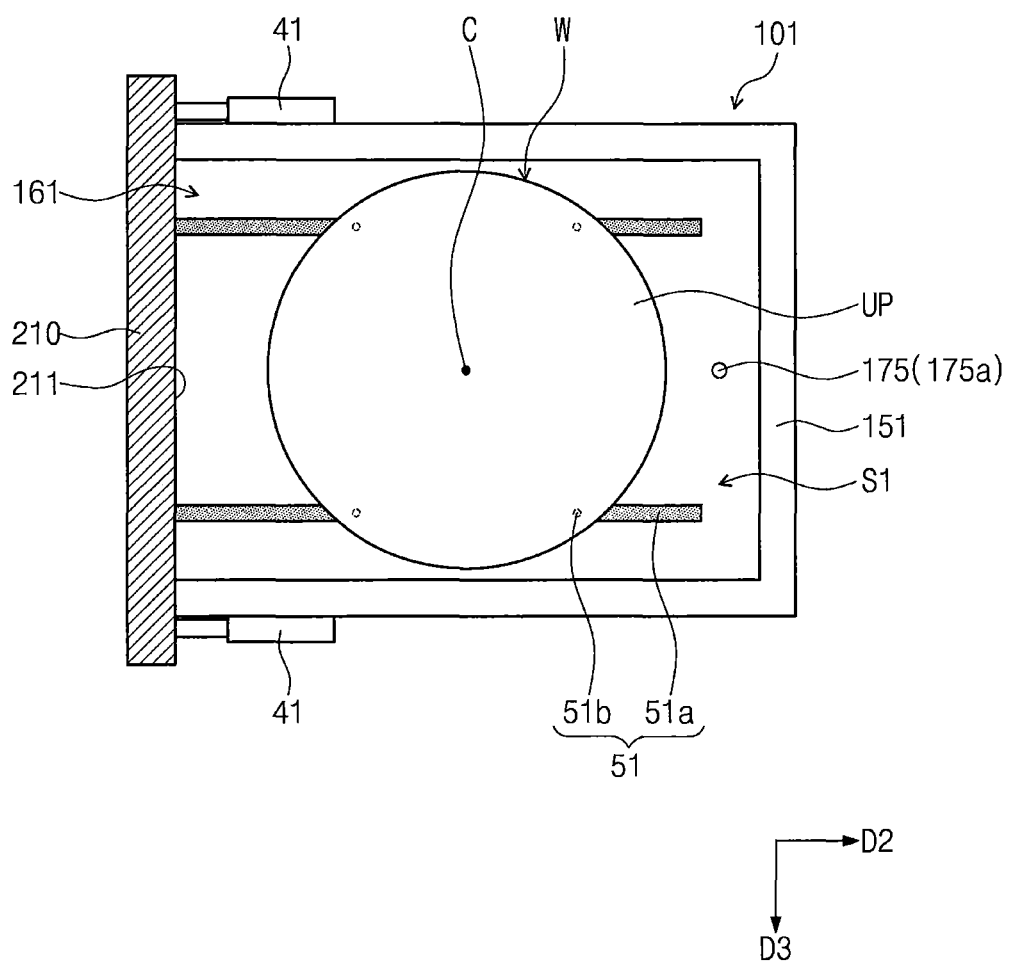
FIG. 7 illustrates a simplified cross sectional view showing a process chamber of FIG. 1.

FIG. 4 illustrates a simplified longitudinal sectional view showing the substrate processing apparatus of FIG. 1. FIG. 5 illustrates an enlarged view showing section A of FIG. 4. FIG. 6 illustrates an enlarged view showing section B of FIG. 4. FIG. 7 illustrates a simplified transverse sectional view showing the process chamber of FIG. 1. FIG. 7 is a cross sectional view corresponding to a first compartment space.

Referring to FIGS. 1 to 7, as discussed above, the housing assembly 100 may include the first housing 101, the second housing 102, and the at least one third housing 103. The first housing 101, the second housing 102, and the third housing 103 may have individual structures that are separated from each other. Alternatively, in other embodiments, the first to third housings 101, 102, and 103 may be formed to have a single unitary body. The housing assembly 100 may include supply holes or passageways 170, exhaust holes or passageways 180, and lower supply holes or passageways 175, all of which penetrate the housing assembly 100. The supply holes 170 may include first, second, and third supply holes 171, 172, and 173, and the exhaust holes 180 may include first, second, and third exhaust holes 181, 182, and 183. The lower supply holes 175 may include first, second, and third lower supply holes 175a, 175b, and 175c.

The first housing 101 may have a first inner space S1 where a drying process is performed to dry the substrate W. The first inner space S1 may also be called a first compartment space. The first housing 101 may be provided in the form of approximately rectangular hexahedron shape, but it is not limited thereto.

The first housing 101 may include a first outer wall 110, a first partition wall 131, and a first side wall 151. The first housing 101 may further include a first protrusion 115, at least one first supply hole or passageway 171 penetrating therethrough, and at least one first exhaust hole or passageway 181 penetrating therethrough. The first supply hole 171 may be spaced apart from the first exhaust hole 181. In an embodiment, the first housing 101 may be provided with one first supply hole 171 and one first exhaust hole 181, but it is not limited thereto. The first housing 101 may include the first lower supply hole or passageway 175a penetrating therethrough. The first outer wall 110 may form a floor or floor region of the process chamber 10. The first outer wall 110 may be positioned below the first partition wall 131. The first outer wall 110 may be spaced apart from the first partition wall 131. The first outer wall 110 may include a first outer surface 111 and a first inner surface 112 opposite each other. The first inner surface 112 may face the first partition wall 131. The first outer wall 111 may partially form or define an outer surface of the process chamber 10. The first outer surface 111 and the first inner surface 112 may be flat.

The first exhaust hole 181 may be provided in or on the first outer wall 110. The first exhaust hole 181 may penetrate the first outer wall 110. For example, the first exhaust hole 181 may connect the first outer surface 111 and the first inner surface 112 to each other. In other words, the first exhaust hole 181 may extend between the first outer surface 111 and the first inner surface 112.

The first partition wall 131 may be positioned above the first outer wall 110. The first partition wall 131 may include a first wall surface 131a and a second wall surface 131b opposite each other. The first wall surface 131a may face the first inner surface 112. The second wall surface 131b may face the second housing 102. The first wall surface 131a and the second wall surface 131b may be flat.

The first partition wall 131 may have a thickness T31 less than a thickness T1 of the first outer wall 110. The thickness may mean a height or length in the first direction D1. The thickness T31 of the first partition wall 131 may be a spacing distance between the first wall surface 131a and the second wall surface 131b. The thickness T1 of the first outer wall 110 may be a spacing distance between the first outer surface 111 and the first inner surface 112. For example, the thickness T1 of the first outer wall 110 may fall within a range from about 30 cm to about 60 cm, but it is not limited thereto. The thickness T31 of the first partition wall 131 may fall within a range from about 1 cm to about 15 cm, but it is not limited thereto.

The thickness T1 of the first outer wall 110 may be selected to endure pressure equal to or greater than a critical pressure of the supercritical fluid. This will be further discussed below with reference to FIG. 10. The first compartment space S1 may have a height H1 greater than the thickness or height T31 of the first partition wall 131 and less than the thickness or height T1 of the first outer wall 110. For example, the height H1 of the first compartment space S1 may fall within a range from about 5 cm to about 25 cm. The height H1 of the first compartment space S1 may be a spacing distance between the first inner surface 112 and the first wall surface 131a.

The first side wall 151 may connect the first outer wall 110 and the first partition wall 131 to each other. For example, the first side wall 151 may have a bottom end connected to the first outer wall 110 and a top end connected to the first partition wall 131. The first side wall 151 may be integrated with the first outer wall 110 and/or the first partition wall 131. The first side wall 151 may include at its one side a first entrance 161 penetrating the first side wall 151. The substrate W may be provided or received through the first entrance 161 into the first housing 101. The first side wall 151 may have a height the same as the height H1 of the first compartment space S1. The height of the first side wall 151 may indicate a distance between the top and bottom ends of the first side wall 151.

The first supply hole 171 may be provided in or on the first partition wall 131. The first supply hole 171 may include a first supply flow path 171a and a second supply flow path 171b. The first supply flow path 171a may extend from the first wall surface 131a toward the second wall surface 131b. The first supply flow path 171a may have one end connected to or extending to the first wall surface 131a. The first supply flow path 171a may have an opposite end between the first wall surface 131a and the second wall surface 131b. The first supply flow path 171a may vertically overlap or be vertically aligned with the first exhaust hole 181.

The second supply flow path 171b may extend from the first supply flow path 171a toward the first side wall 151. The second supply flow path 171b may extend along a second direction D2 perpendicular to the first direction D1. The second direction D2 may be a front-and-rear direction or parallel to a front-and-rear direction. The second direction D2 may be horizontal. The second supply flow path 171b may be connected to or extend to the outer surface of the process chamber 10.

The first lower supply hole 175a may be provided in or on the first outer wall 110. In other embodiments, the first lower supply hole 175a may be provided in or on the first side wall 151. The first lower supply hole 175a may be positioned below the substrate W and/or the substrate support 51 in the first compartment space S1.

The first protrusion 115 may extend from the first outer wall 110 along a direction opposite to the second direction D2. The first protrusion 115 may have a thickness less than the thickness T1 of the first outer wall 110. The first protrusion 115 may have a bottom surface at the same plane as the first outer surface 111. The first protrusion 115 may include a first insert opening 117 into which the fixing member 60 may be inserted or partially inserted.

The second housing 102 may be positioned on the first housing 101. In an embodiment, the second housing 102 may be spaced apart in the first direction D1 from the first housing 101. In other embodiments, the second housing 102 may be stacked on the first housing 101. The second housing 102 may have a second inner space S2 where a drying process is performed to dry the substrate W. The second housing 102 may be provided in the form of approximately rectangular hexahedron shape. The second inner space S2 may also be called a second compartment space.

The second housing 102 may include a second outer wall 120, a second partition wall 132, and a second side wall 153. The second housing 102 may further include a second protrusion 125, at least one second supply hole or passageway 172 penetrating therethrough and at least one second exhaust hole or passageway 182 penetrating therethrough. The second supply hole 172 may be spaced apart from the second exhaust hole 182. In an embodiment, the second housing 102 may be provided with one second supply hole 172 and one second exhaust hole 182, but it is not limited thereto. The second housing 102 may include a second lower supply hole or passageway 175b penetrating therethrough.

The second outer wall 120 may form a top or top region of the process chamber 10. The second outer wall 120 may be positioned above the second partition wall 132. The second outer wall 120 may be spaced apart from the second partition wall 132. The second outer wall 120 may include a second outer surface 121 and a second inner surface 122 opposite each other. The second inner surface 122 may face the second partition wall 132. The second outer surface 121 may partially form or define the outer surface of the process chamber 10. The second outer surface 121 and the second inner surface 122 may be flat.

The second supply hole 172 may be provided on the second outer wall 120. The second supply hole 172 may penetrate the second outer wall 120. For example, the second supply hole 172 may connect the second outer surface 121 and the second inner surface 122 to each other. In other words, the second supply hole 172 may extend between the second outer surface 121 and the second inner surface 122.

The second partition wall 132 may be positioned below the second outer wall 120. The second partition wall 132 may include a third wall surface 132a and a fourth wall surface 132b opposite each other. The third wall surface 132a may face the second wall surface 131b. The fourth wall surface 132b may face the second inner surface 122. The third wall surface 132a and the fourth wall surface 132b may be flat.

The second partition wall 132 may have a thickness or height T32 less than a thickness or height T2 of the second outer wall 120. The thickness T32 of the second partition wall 132 may be a spacing distance between the third wall surface 132a and the fourth wall surface 132b. The thickness T2 of the second outer wall 120 may be a spacing distance between the second outer surface 121 and the second inner surface 122. The thickness T2 of the second outer wall 120 may be the same as or different from the thickness T1 of the first outer wall 110. For example, the thickness T2 of the second outer wall 120 may fall within a range from about 30 cm to about 60 cm, but it is not limited thereto. The thickness T32 of the second partition wall 132 may fall within a range from about 1 cm to about 15 cm, but it is not limited thereto. The thickness T2 of the second outer wall 120 may be formed enough to endure pressure equal to or greater than a critical pressure of the supercritical fluid. This will be further discussed below with reference to FIG. 10.

The second compartment space S2 may have a height H2 greater than the thickness T32 of the second partition wall 132 and less than the thickness T2 of the second outer wall 120. The height 112 of the second compartment space S2 may be the same as or different from the height H1 of the first compartment space S1. For example, the height H2 of the second compartment space S2 may fall within a range from about 5 cm to about 25 cm. The height H2 of the second compartment space S2 may be a spacing distance between the second inner surface 122 and the fourth wall surface 132b.

The second side wall 153 may connect the second outer wall 120 and the second partition wall 132 to each other. For example, the second side wall 153 may have a top end connected to the second outer wall 120 and a bottom end connected to the second partition wall 132. The second side wall 153 may include at its one side a second entrance 163 penetrating the second side wall 153. The second entrance 163 may vertically overlap or be vertically aligned with the first entrance 161. The second entrance 163 may be spaced apart in the first direction D1 from the first entrance 161. The substrate W may be provided or received through the second entrance 163 into the second housing 102. The second side wall 153 may have a height the same as the height H2 of the second compartment space S2. The height of the second side wall 153 may indicate a distance between the top and bottom ends of the second side wall 153.

The second exhaust hole 182 may be provided in or on the second partition wall 132. The second exhaust hole 182 may include a first exhaust flow path 182a and a second exhaust flow path 182b. The first exhaust flow path 182a may extend from the fourth wall surface 132b toward the third wall surface 132a. The first exhaust flow path 182a may have one end connected to the fourth wall surface 132b. The first exhaust flow path 182a may have an opposite end between the third wall surface 132a and the fourth wall surface 132b. The first exhaust flow path 182a may vertically overlap or be vertically aligned with the second supply hole 172.

The second exhaust flow path 182b may extend from the first exhaust flow path 182a toward the second side wall 153. The second exhaust flow path 182b may extend along the second direction D2. The second exhaust flow path 182b may be connected to the outer surface of the process chamber 10.

The second lower supply hole 175b may be provided in or on the second partition wall 132. In other embodiments, the second lower supply hole 175b may be provided on the second side wall 153. The second lower supply hole 175b may be positioned below the substrate W and/or the substrate support 52 in the second compartment space S2.

The second protrusion 125 may extend from the second outer wall 120 along a direction opposite to the second direction D2. The second protrusion 125 may have a thickness less than the thickness T2 of the second outer wall 120. The second protrusion 125 may have a top surface at the same plane as the second outer surface 121. The second protrusion 125 may include a second insert opening 127 into which the fixing member 60 is inserted or partially inserted. Each of the first and second insert openings 117 and 127 may have a hole shape and/or a groove shape. In an embodiment, each of the first and second insert openings 117 and 127 may have a circular or hole shape.

The third housing 103 may be positioned between the first housing 101 and the second housing 102. In an embodiment, the third housing 103 may be stacked on the first housing 101. The second housing 102 may be stacked on the third housing 103. In other embodiments, a plurality of the third housings 103 may be provided. The plurality of third housings 103 may be sequentially stacked along the first direction D1 (e.g., vertically).

The third housing 103 may have a third inner space S3 where a drying process is performed to dry the substrate W. The third inner space S3 may also be called a third compartment space. The third housing 103 may be provided in the form of approximately rectangular hexahedron shape. The third housing 103 may include a third partition wall 133, a fourth partition wall 134, and a third side wall 155. The third housing 103 may further include at least one third supply hole or passageway 173 penetrating therethrough and at least one third exhaust hole or passageway 183 penetrating therethrough. The third supply hole 173 may be spaced apart from the third exhaust hole 183. The third housing 103 may include a third lower supply hole or passageway 175c penetrating therethrough.

The third partition wall 133 may be positioned on the first housing 101. The third partition wall 133 may be spaced apart from the fourth partition wall 134. The third partition wall 133 may include a fifth wall surface 133a and a sixth wall surface 133b opposite each other. The fifth wall surface 133a may face the first housing 101 and/or a fourth partition wall 134 of another third housing 103. The sixth wall surface 133b may face the fourth partition wall 134. The fifth wall surface 133a and the sixth wall surface 133b may be flat. Although FIG. 5 illustrates that the fifth wall surface 133a is not in contact with the second wall surface 131b, the fifth wall surface 133a may actually come into contact with the second wall surface 131b.

The third exhaust hole 183 may be provided in or on the third partition wall 133. The third exhaust hole 183 may include a third exhaust flow path 183a and a fourth exhaust flow path 183b. The third exhaust flow path 183a may extend from the sixth wall surface 133b toward the fifth wall surface 133a. The third exhaust flow path 183a may have one end connected to or extending from the sixth wall surface 133b. The third exhaust flow path 183a may have an opposite end between the fifth wall surface 133a and the sixth wall surface 133b. The fourth exhaust flow path 183b may extend from the third exhaust flow path 183a toward the third side wall 155. For example, the fourth exhaust flow path 183b may extend along the second direction D2. The fourth exhaust flow path 183b may be connected to or extend to the outer surface of the process chamber 10.

The fourth partition wall 134 may be spaced apart in the first direction D1 from the third partition wall 133. The fourth partition wall 134 may be positioned between the third partition wall 133 and the second partition wall 132. The fourth partition wall 134 may be positioned between the third partition wall 133 and a third partition wall 133 of another third housing 103. The fourth partition wall 134 may include a seventh wall surface 134a and an eighth wall surface 134b opposite each other. The seventh wall surface 134a may face the sixth wall surface 133b. The eighth wall surface 134b may face the second partition wall 132 and/or a third partition wall 134 of another third housing 103. The seventh wall surface 134a and the eighth wall surface 134b may be flat. FIG. 6 shows that the eighth wall surface 134b and the third wall surface 132a are not in contact with each other. In contrast, the eighth wall surface 134b may come into contact with the third wall surface 132a.

The third supply hole 173 may be provided in or on the fourth partition wall 134. The third supply hole 173 may be spaced apart in the first direction D1 from the third exhaust hole 183. The third supply hole 173 may include a third supply flow path 173a and a fourth supply flow path 173b. The third supply flow path 173a may extend from the seventh wall surface 134a toward the eighth wall surface 134b. The third supply flow path 173a may have one end connected to or extending from the seventh wall surface 134a. The third supply flow path 173a may have an opposite end between the seventh wall surface 134a and the eighth wall surface 134b.

The fourth supply flow path 173b may be connected to the third supply flow path 173a. The fourth supply flow path 173b may extend from the third supply flow path 173a toward the third side wall 155. The fourth supply flow path 173b may extend along the second direction D2. The fourth supply flow path 173b may be connected or extend to the outer surface of the process chamber 10.

The third lower supply hole 175c may be provided in or on the third partition wall 133. In other embodiments, the third lower supply hole 175c may be provided in or on the third side wall 155. The third lower supply hole 175c may be positioned below the substrate W and/or the substrate support 53 in the third compartment space S3.

The first exhaust hole 181, the first supply flow path 171a, the second supply hole 172, the first exhaust flow path 182a, the third exhaust flow path 183a, and the third supply flow path 173a may extend along the first direction D1. The first exhaust hole 181, the first supply flow path 171a, the second supply hole 172, the first exhaust flow path 182a, the third exhaust flow path 183a, and the third supply flow path 173a may vertically overlap each other or be vertically aligned with each other. The first exhaust hole 181, the first supply flow path 171a, the second supply hole 172, the first exhaust flow path 182a, the third exhaust flow path 183a, and the third supply flow path 173a may be positioned on an imaginary line that passes through a center C of the substrate W placed within the compartment spaces S1, S2, and S3.

The supply holes 170 may be positioned above the substrate W and/or above the substrate support 50. In this configuration, the supply holes 170 may discharge the supercritical fluid onto a top surface UP of the substrate W. The supply hole 170 may vertically overlap or align with the substrate W placed on the substrate support 50. The lower supply holes 175 may be positioned below the substrate W and/or below the substrate support 50. The lower supply holes 175 may not vertically overlap the substrate W placed on the substrate support 50.

The third and fourth partition walls 133 and 134 may respectively have thicknesses or heights T33 and T34 that are less than the thickness T1 of the first outer wall 110 and/or less than the thickness T2 of the second outer wall 120. The thickness T33 of the third partition wall 133 may be a spacing distance between the fifth wall surface 133a and the sixth wall surface 133b. The thickness T34 of the fourth partition wall 134 may be a spacing distance between the seventh wall surface 134a and the eighth wall surface 134b.

For example, the thicknesses T33 and T34 of the third and fourth partition walls 133 and 134 may fall within a range from about 1 cm to about 15 cm, but are not limited thereto.

The third compartment space S3 may have a height H3 greater than each of the thicknesses T33 and T34 of the third and fourth partition walls 133 and 134. For example, the height H3 of the third compartment space S3 may fall within a range from about 5 cm to about 25 cm. The height H3 of the third compartment space S3 may be a spacing distance between the sixth wall surface 133b and the seventh wall surface 134a. The height H3 of the third compartment space S3 may be less than the thickness T1 of the first outer wall 110 and/or less than the thickness T2 of the second outer wall 120.

The third side wall 155 may connect the third partition wall 133 and the fourth partition wall 134 to each other. The third side wall 155 may have a bottom end connected to or defining a boundary of the third partition wall 133 and a top end connected to or defining a boundary of the fourth partition wall 134. The third side wall 155 may include at its one side a third entrance 165 penetrating the third side wall 155. The substrate W may be provided through the third entrance 165 into the third housing 103. The third side wall 155 may have a height the same as the height H3 of the third compartment space S3. The height of the third side wall 155 may indicate a distance between the top and bottom ends of the third side wall 155.

In an embodiment, the first to fourth partition walls 131, 132, 133, and 134 may respectively have the thicknesses T31, T32, T33, and T34 that are approximately the same as each other, but not limited thereto. In addition, the first to third compartment spaces S1, S2, and S3 may respectively have the heights H1, H2, and H3 that are approximately the same as each other, but they are not limited thereto.

The shield assembly 200 may close or cover a plurality of the entrances 160 formed on the process chamber 10 and/or on the housing assembly 100. In an embodiment, the shield assembly 200 may include first, second, and third shield members 210, 220, and 230. The shield assembly 200 may be positioned between the first protrusion 115 and the second protrusion 125.

The first shield member 210 may close the first entrance 161 of the first housing 101. The second shield member 220 may close the second entrance 163 of the second housing 102. The third shield member 230 may close the third entrance 165 of the third housing 103.

The door unit 40 may move the first to third shield members 210, 220, and 230 in a direction toward and/or away from the entrances 160. For example, the door unit 40 may move each of the first to third shield members 210, 220, and 230 in a direction parallel to the second direction D2.

The door unit 40 may be installed on the process chamber 10. The door unit 40 may include a plurality of actuators 41, 42, and 43. The number of the actuators 41, 42, and 43 may correspond to the number of the shield members 210, 220, and 230. The actuators 41, 42, and 43 may be but are not limited to a pneumatic or hydraulic cylinder.

The substrate support 50 may support the substrate W. The substrate support 50 may be positioned in each of the compartment spaces S1, S2, and S3. In an embodiment, the substrate support 50 may be installed on or coupled to the shield assembly 200. The substrate support 50 may include first, second, and third substrate support members 51, 52, and 53.

The first substrate support member 51 may be installed on or coupled to the first shield member 210, and may be positioned between the first supply hole 171 and the first exhaust hole 181. The second substrate support member 52 may be installed on or coupled to the second shield member 220, and may be positioned between the second supply hole 172 and the second exhaust hole 182. The third substrate support member 53 may be installed on or coupled to the third shield member 230, and may be positioned between the third supply hole 173 and the third exhaust hole 183. In other embodiments, the substrate support 50 may be installed at the housing assembly 100. The first to third substrate support members 51, 52, and 53 may be identically configured to each other. Hereinafter, the first substrate support member 51 will be mainly described below.

As illustrated in FIG. 7, the first substrate support member 51 may include a pair of first horizontal rods 51a that extend in the second direction D2 from a first shield surface 211 of the first shield member 210. The first horizontal rods 51a may be spaced apart from each other in a third direction D3 perpendicular to the first and second directions D1 and D2. For example, the third direction D3 may be parallel to a left-and-right direction. Each of the first horizontal rods 51a may include a first portion that vertically overlaps or aligns with an edge of the substrate W. Each of the first horizontal rods 51a may be provided in the form of a thin plate.

The first substrate support member 51 may include at least one first support protrusion 51b that protrudes in the first direction D1 from top surfaces of the first horizontal rods 51a. The first support protrusion 51b may be provided on the first portion. The substrate W may be placed on the first support protrusion 51b. A plurality of the first support protrusions 51b may be provided.

The fluid supply 20 may be engaged with or in fluid communication with the supply holes 170 and the lower supply holes 175. In an embodiment, the fluid supply 20 may be connected to the first to third supply holes 171, 172, and 173 and the first to third lower supply holes 175a, 175b, and 175c. Accordingly, the fluid supply 20 may provide the supercritical fluid into the first to third compartment spaces S1, S2, and S3. This will be further discussed in detail below with reference to FIGS. 8A, 8B, 8C, and 9.

The fluid exhaust 30 may be connected to the first to third exhaust holes 181, 182, and 183. Accordingly, the fluid exhaust 30 may discharge the supercritical fluid from the first to third compartment spaces S1, S2, and S3. This will be further discussed in detail below with reference to FIG. 8C.

The fixing member 60 may be spaced apart from the entrances 160 in a direction opposite to the second direction D2. The fixing member 60 may be inserted into the first and second inset openings 117 and 127. When the fixing member 60 are inserted into the first and second inset openings 117 and 127, the fixing member 60 may be fixedly attached to the process chamber 10. Therefore, the fixing member 60 may limit movement of the shield assembly 200 positioned between the fixing member 60 and the entrances 160. In an embodiment, the fixing member 60 may include a plurality of bars that extend along the first direction D1. The bars may be spaced apart from each other in the third direction D3.

It will be hereinafter described a substrate drying process using the substrate processing apparatus discussed above. In an embodiment, the substrate drying process may include a pressure rise step, a dry step, and an exhaust step. The pressure rise step, dry step, and exhaust step will be described below with reference to FIGS. 8A, 8B, 8C, and 9.

Figure 8A:
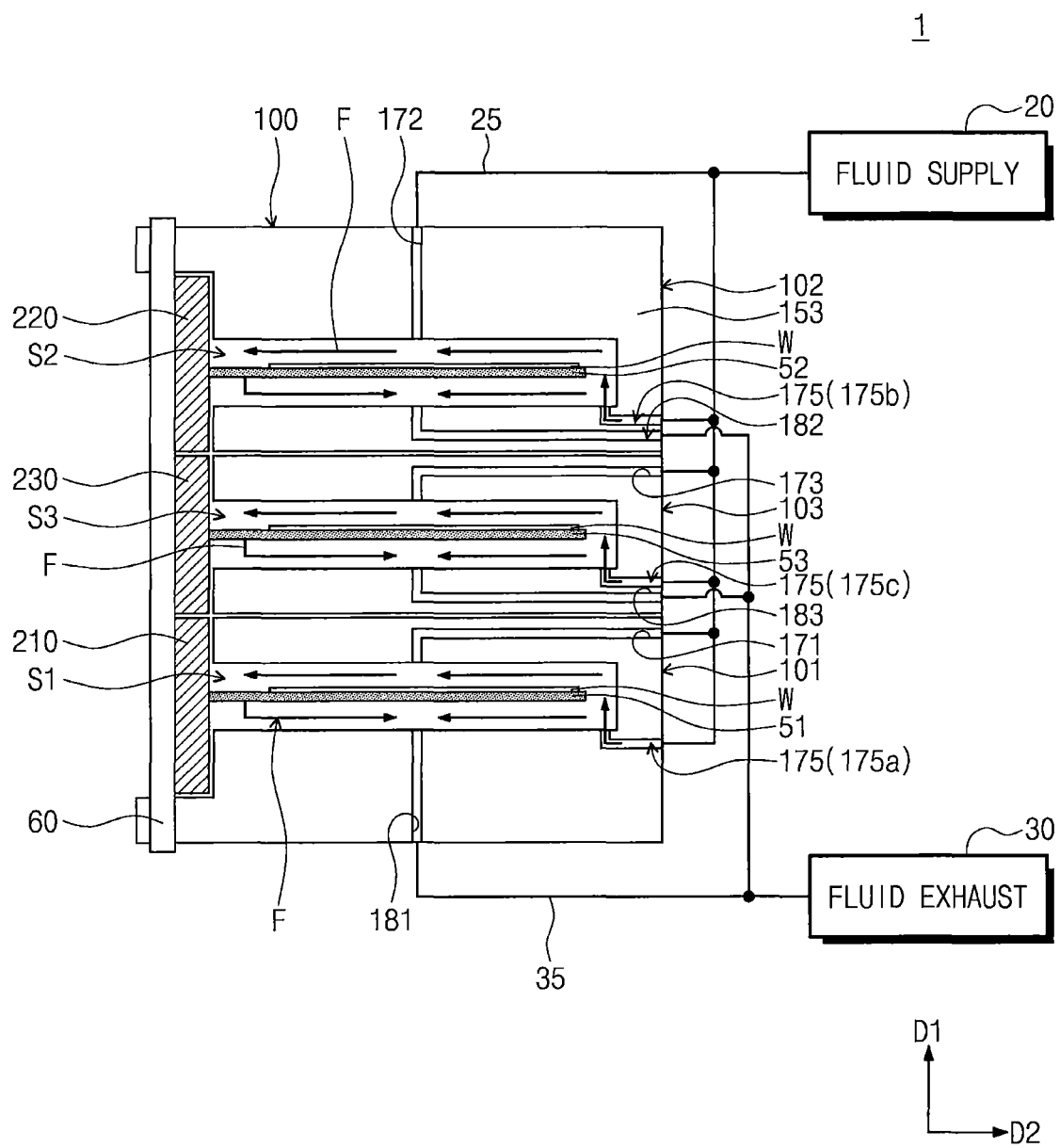
FIGS. 8A to 8C illustrate simplified longitudinal sectional views showing a substrate drying process performed in the substrate processing apparatus of FIG. 1.
Figure 8B:
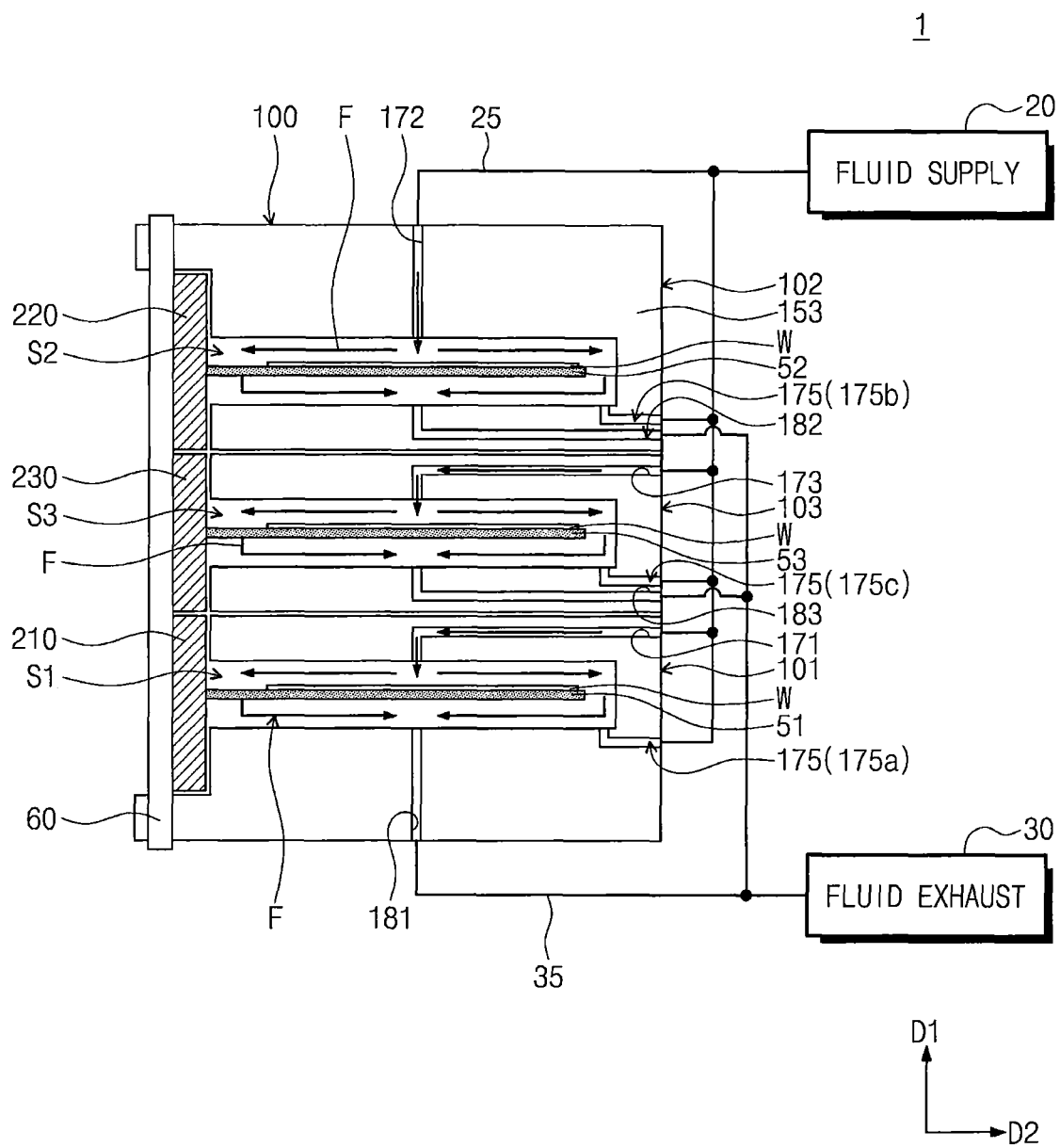
Figure 8C:
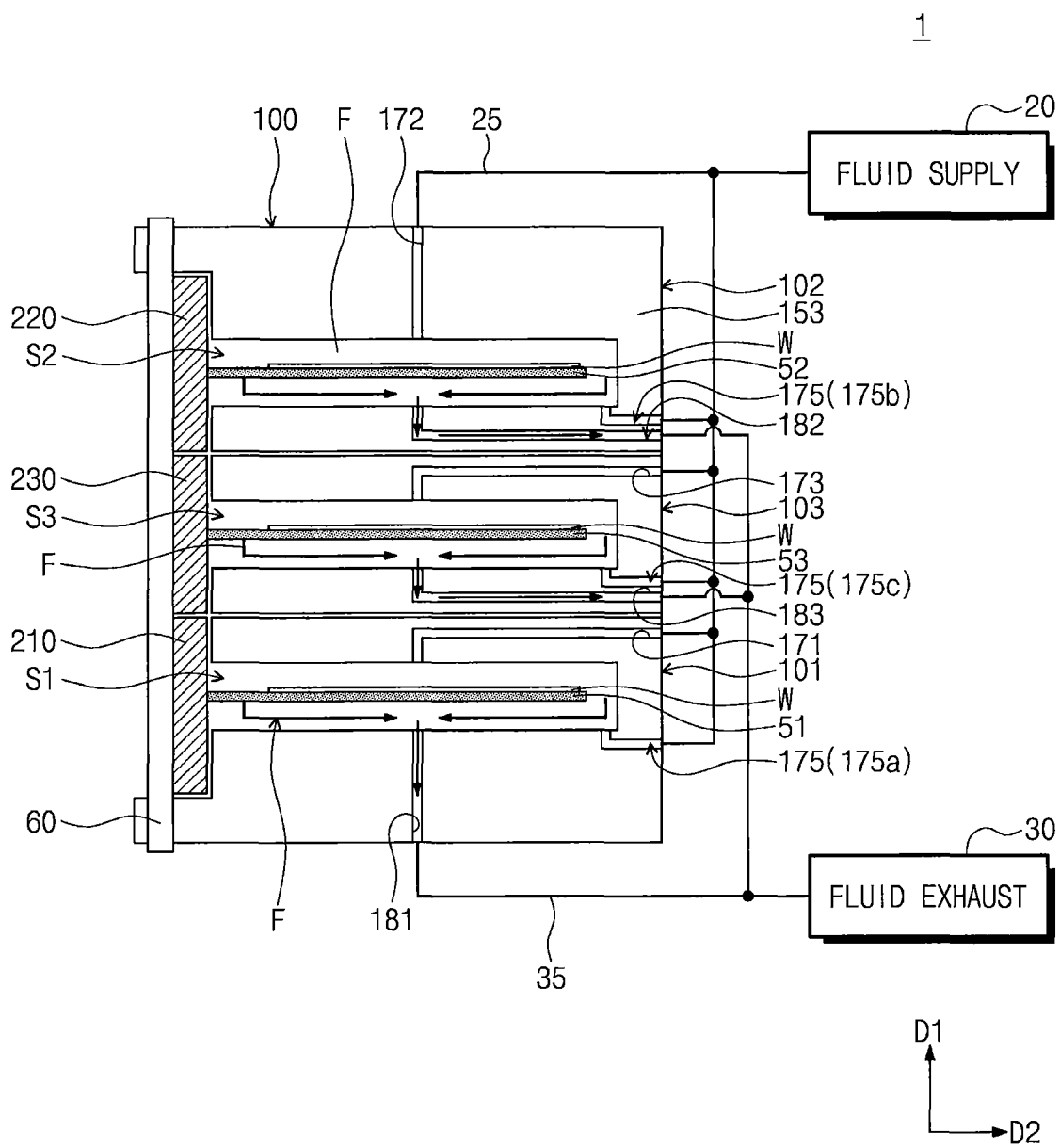
Figure 9:
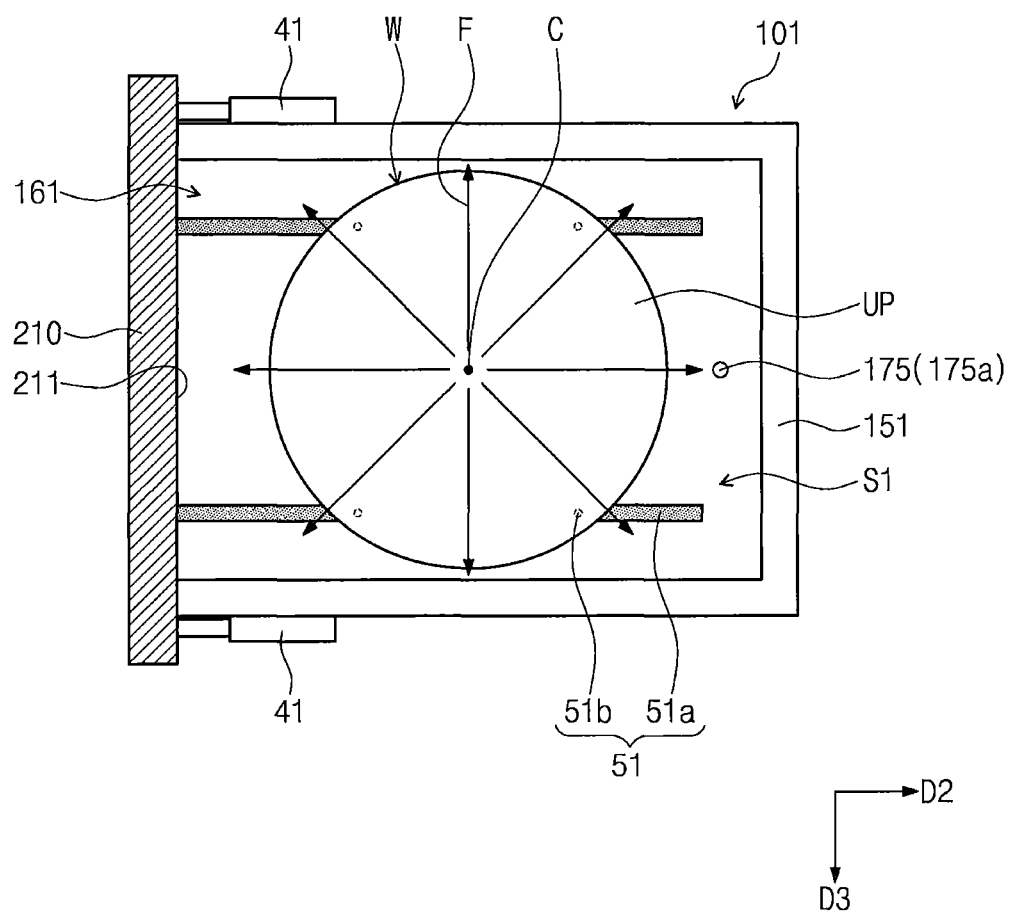
FIG. 9 illustrates a simplified cross sectional view showing fluid supply to a first housing of FIG. 8B.

FIGS. 8A to 8C illustrate longitudinal sectional views showing a substrate drying process performed in the substrate processing apparatus of FIG. 1. FIG. 9 illustrates a cross sectional view showing fluid supply to the first housing of FIG. 8B.

Referring to FIG. 8A, the fluid supply 20 may supply a supercritical fluid F through the lower supply holes 175 into the first to third compartment spaces S1, S2, and S3. As the lower supply holes 175 and the substrate W are not vertically overlapped or aligned with each other, the supercritical fluid F discharged from the lower supply holes 175 may not be directly sprayed onto a bottom surface of the substrate W. The supercritical fluid F may diffuse in the first to third compartment spaces S1, S2, and S3. The supercritical fluid F may cause the first to third compartment spaces S1, S2, and S3 to have increased inner pressures therein. The aforementioned pressure rise step may thus be carried out.

In the pressure rise step, the first to third compartment spaces S1, S2, and S3 may be supplied with the supercritical fluid F, and as a result, the inner pressures of the first to third compartment spaces S1, S2, and S3 may become elevated above the atmospheric pressure. The first to third compartment spaces S1, S2, and S3 may be supplied with the supercritical fluid F until their inner pressures reach or exceed a critical pressure of the supercritical fluid F. For example, in the pressure rise step, the first to third compartment spaces S1, S2, and S3 may be supplied with the supercritical fluid F during or for a predetermined time period.

When the supercritical fluid F is supplied through the supply holes 170 into the first to third compartment spaces S1, S2, and S3 whose inner pressures have not yet reached the critical pressure, the supercritical fluid F may be liquefied due to the low pressure condition. The substrate W may receive the liquefied fluid in the free-fall state, and thus patterns on the substrate W may collapse.

Referring to FIGS. 8B and 9, the dry step may be performed when the inner pressures of the first to third compartments spaces S1, S2, and S3 are equal to or above the critical pressure of the supercritical fluid F. In the dry step, the supercritical fluid F may be supplied onto the top surface UP of the substrate W in a condition that the inner pressures of the first to third compartment spaces S1, S2, and S3 are increased to or above the critical pressure of the supercritical fluid F, thereby drying the substrate W. Namely, the dry step may be performed when the first to third compartment spaces S1, S2, and S3 are under the supercritical state.

In an embodiment, the fluid supply 20 may supply the supercritical fluid F through the supply holes 170 into the first to third compartment spaces S1, S2, and S3. The fluid supply 20 may not supply the supercritical fluid F to the lower supply holes 175. The supercritical fluid F discharged from the supply holes 170 may be provided directly onto the center C on the top surface UP of the substrate W.

The supplied supercritical fluid F may flow toward an edge of the substrate W from the center C on the top surface UP of the substrate W. For example, the supercritical fluid F may flow away from the center C on the top surface UP of the substrate W in a direction or directions perpendicular to the first direction D1 (e.g., a plurality of different radial directions from the center C). Accordingly, the supercritical fluid F may be uniformly provided on an entirety of the top surface UP of the substrate W.

The supercritical fluid F may dissolve an organic solvent remaining on the entirety of the top surface UP of the substrate W. The substrate drying process may be uniformly performed on the entirety of the top surface UP of the substrate W. Thus, the substrate drying process may increase in processing efficiency. The supercritical fluid F reaching the edge of the substrate W may flow downward from the substrate W.

In the dry step, the first to third compartment spaces S1, S2, and S3 may be supplied with the supercritical fluid F during or for a predetermined time period. After the predetermined time period, the supercritical fluid F may not be supplied any further.

Referring to FIG. 8C, the dry step may be followed by the exhaust step. In the exhaust step, a remaining fluid may be discharged out from the first to third compartment spaces S1, S2, and S3. Thus, the inner pressure of the first to third compartment spaces S1, S2, and S3 may decrease.

For example, after stopping supply of the supercritical fluid F, a fluid remaining in the first to third compartment spaces S1, S2, and S3 may be discharged through the first to third exhaust holes 181, 182, and 183 to the outside.

The discharge of the remaining fluid may decrease the inner pressures of the first to third compartment spaces S1, S2, and S3. The discharge of the remaining fluid may continue until the inner pressures of the first to third compartment spaces S1, S2, and S3 reach the atmospheric pressure.

When the first to third compartment spaces S1, S2, and S3 are at the atmospheric pressure, the door unit (see 40 of FIG. 3) may open the first to third entrances (see 161, 163, and 165 of FIG. 4). After finishing the drying process performed on the substrate W in the first to third compartment spaces S1, S2, and S3, a substrate transfer apparatus (see 3 of FIG. 21) may transfer the substrate W in the first to third compartment spaces S1, S2, and S3 to the outside of the process chamber 10 through the first to third entrances 161, 163, and 165 that have been opened.

Figure 10:
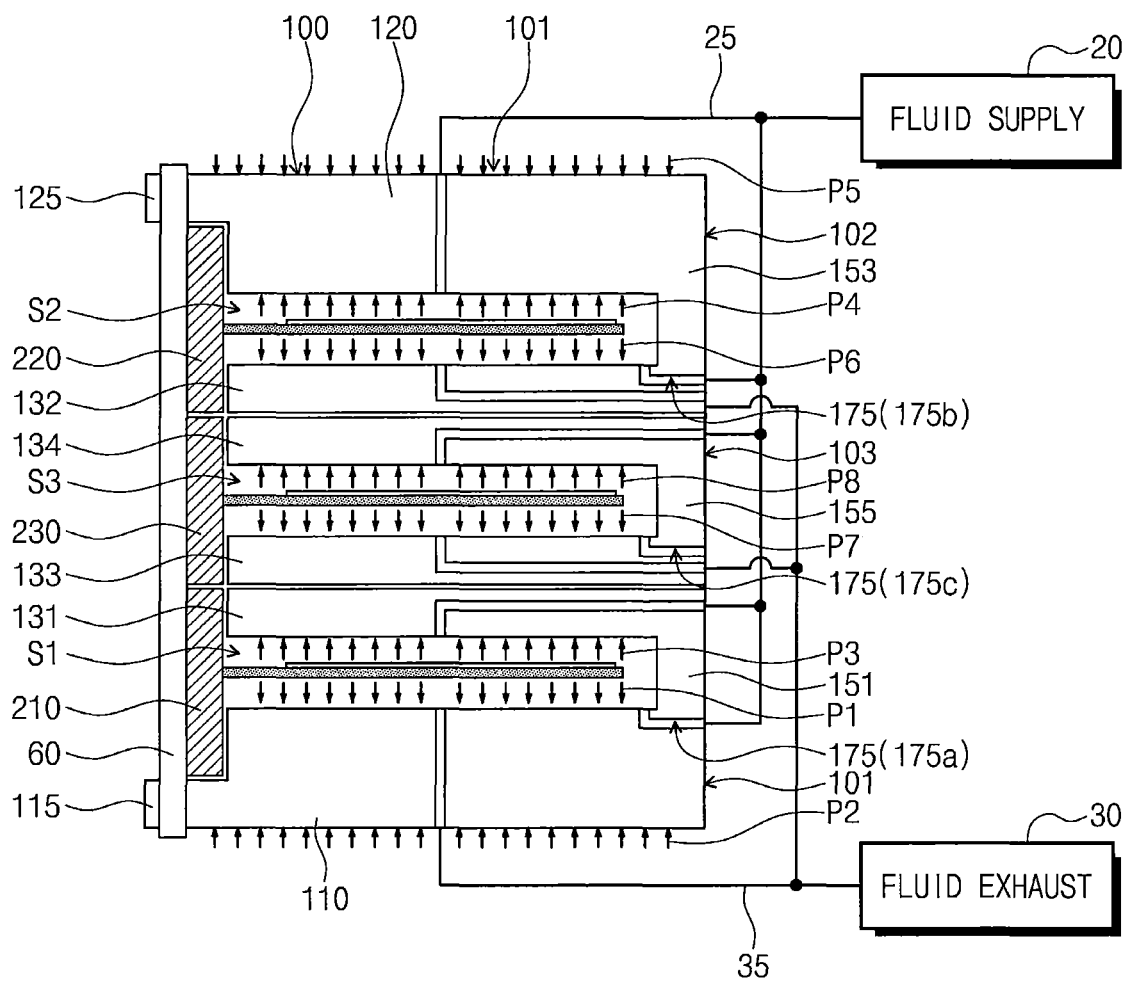
FIG. 10 illustrates a simplified longitudinal sectional view showing forces exerted on a process chamber whose compartment spaces of FIG. 1 are under high pressure state.
Figure 10:
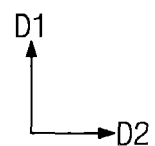

FIG. 10 illustrates a simplified longitudinal sectional view showing forces exerted on the process chamber whose compartment spaces of FIG. 1 are under high pressure state. In an embodiment, the phrase "high pressure state" may mean a state in which a pressure reaches or exceeds the critical pressure of the supercritical fluid. For example, in the dry step mentioned above, the first to third compartment spaces may be maintained under high pressure state.

Referring to FIGS. 4, 5, 6, and 10, when the supercritical fluid is supplied into the first housing 101, the second housing 102, and the third housing 103, the first to third compartment spaces S1, S2, and S3 may respectively have first to third inner pressures that are increased above the atmospheric pressure. For example, the first to third inner pressures may reach or exceed the critical pressure of the supercritical fluid.

When the first inner pressure is at or above the critical pressure, a first force P1 may be exerted on the first inner surface 112 in a reverse or opposite direction (referred to as a downward direction) to the first direction D1, a second force P2 may be exerted on the first outer surface 111 in the first direction D1, and a third force P3 may be exerted on the first wall surface 131a in the first direction D1. As the second wall surface 131b may be in contact with the third partition wall 133 of the third housing 103, the second wall surface 131b may experience a seventh force P7 which will be discussed below. The first force P1 may be obtained by multiplying an area of the first inner surface 112 by the first inner pressure. The second force P2 may be obtained by multiplying an area of the first outer surface 111 by the atmospheric pressure. The third force P3 may be obtained by multiplying an area of the first wall surface 131a by the first inner pressure.

When the second inner pressure is at or above the critical pressure, a fourth force P4 may be exerted on the second inner surface 122 in the first direction D1, a fifth force P5 may be exerted on the second outer surface 121 in the downward direction, and a sixth force P6 may be exerted on the fourth wall surface 132b in the downward direction. As the third wall surface 132a may be in contact with the fourth partition wall 134 of the third housing 103, the third wall surface 132a may experience an eighth force P8 which will be discussed below.

When the third inner pressure is at or above the critical pressure, a seventh force P7 may be exerted on the sixth wall surface 133b in the downward direction, and an eighth force P8 may be exerted on the seventh wall surface 134a in the first direction D1. As the fifth wall surface 133a may be in contact with the first partition wall 131 and/or with a fourth partition wall 134 of another third housing 103, the fifth wall surface 133a may experience the third force P3 and/or the eighth force P8. As the eighth wall surface 134b may be in contact with the second partition wall 132 and/or a third partition wall 133 of another third housing 103, the eighth wall surface 134b may experience the sixth force P6 and/or the seventh force P7.

In an embodiment, the first and second inner surfaces 112 and 122, the first and second outer surfaces 111 and 121, and the first to eighth wall surfaces 131a, 131b, 132a, 132b, 133a, 133b, 134a, and 134b may have the same area as each other. In addition, the first to third inner pressures may be the same. As a result, the first, third, fourth, sixth, seventh, and eighth forces P1, P3, P4, P6, P7, and P8 may have approximately the same magnitude as each other, and the second and fifth forces P2 and P5 may have approximately the same magnitude as each other. In an embodiment, the second and fifth forces P2 and P5 may be less than the first, third, fourth, sixth, seventh, and eighth forces P1, P3, P4, P6, P7, and P8.

The second force P2 may partially counterbalance the first force P1. The first outer wall 110 may experience a force in the downward direction. The fifth force P5 may partially counterbalance the fourth force P4. The second outer wall 120 may experience a force in the first direction D1. Each of the first and second outer walls 110 and 120 may experience a force either in the downward direction or in the first direction D1.

For example, when a pressure difference of about 10 MPa is produced between the atmospheric pressure and each of the first and second inner pressures, it may be required that the thicknesses T1 and T2 of the first and second outer walls 110 and 120 made of stainless steel should be more than about 67.3 mm so as to endure the first and second inner pressures. When a pressure difference of about 20 MPa is produced between the atmospheric pressure and each of the first and second inner pressures, it may be required that the thicknesses T1 and T2 of the first and second outer walls 110 and 120 made of stainless steel should be more than about 133.6 mm so as to endure the first and second inner pressures. For example, it may be necessary that the thicknesses T1 and T2 of the first and second outer walls 110 and 120 should increase with increasing first and second inner pressures.

In contrast, the third force P3 and the seventh force P7 may counterbalance each other, and the sixth force P6 and the eighth force P8 may counterbalance each other. For example, the first to fourth partition walls 131, 132, 133, and 134 may barely experience a force either in the downward direction or the first direction D1. Namely, the thicknesses T31, T32, T33, and T34 of the first to fourth partition walls 131, 132, 133, and 134 may hardly be affected by the first to third inner pressures. Therefore, even if the thicknesses T31, T32, T33, and T34 of the first to fourth partition walls 131, 132, 133, and 134 are less than the thicknesses T1 and T2 of the first and second outer walls 110 and 120, the thicknesses T31, T32, T33, and T34 may be enough to endure the first to third inner pressures.

The thicknesses T31, T32, T33, and T34 of the first to fourth partition walls 131, 132, 133, and 134 may be less than the thicknesses T1 and T2 of the first and second outer walls 110 and 120. As a result, the process chamber 10 may become compact-sized while having a plurality of compartment spaces S1, S2, and S3.

Figure 11:
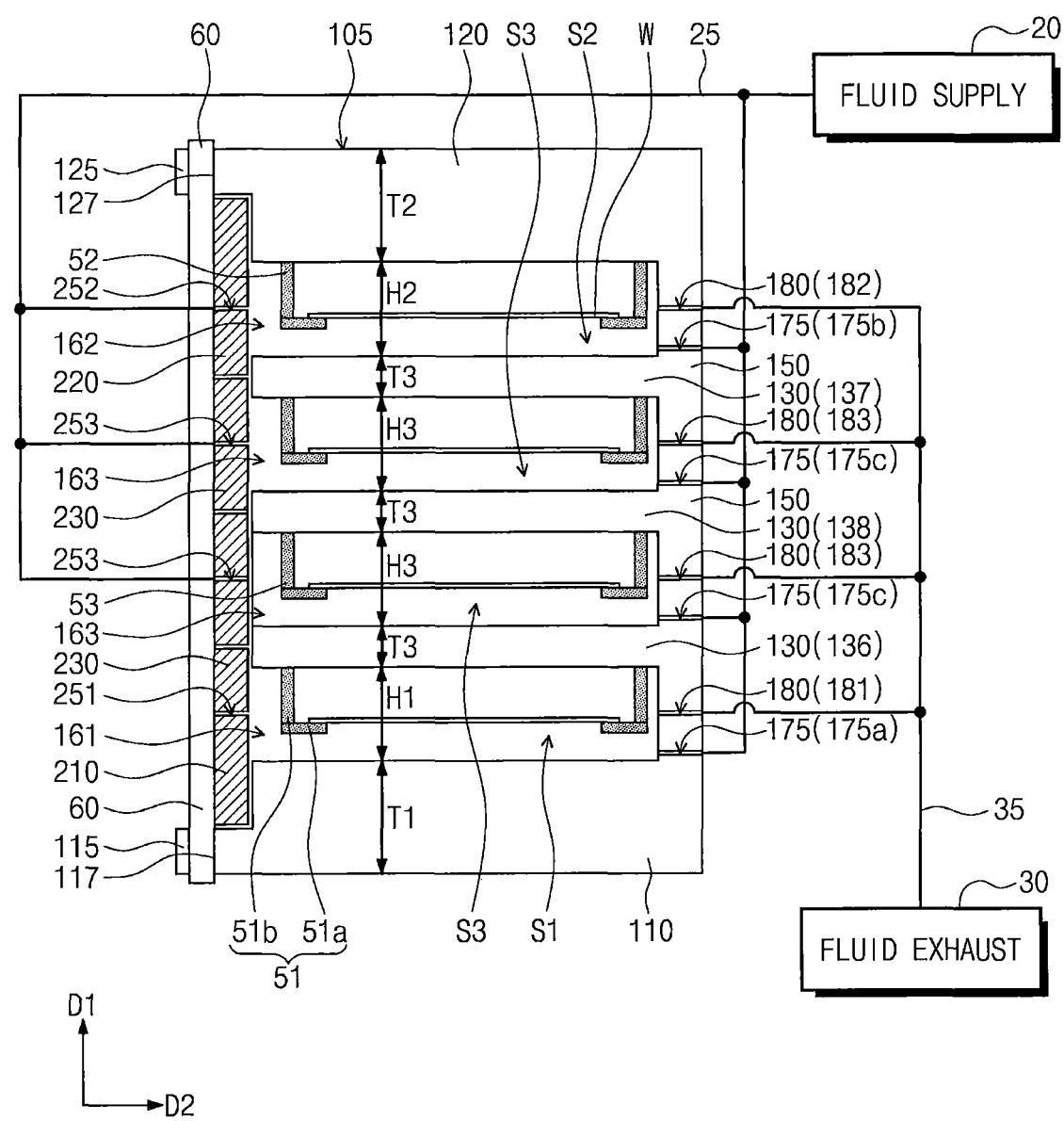
FIG. 11 illustrates a simplified longitudinal sectional view showing an example of the substrate processing apparatus according to example embodiments of the present inventive concepts.
Figure 12:
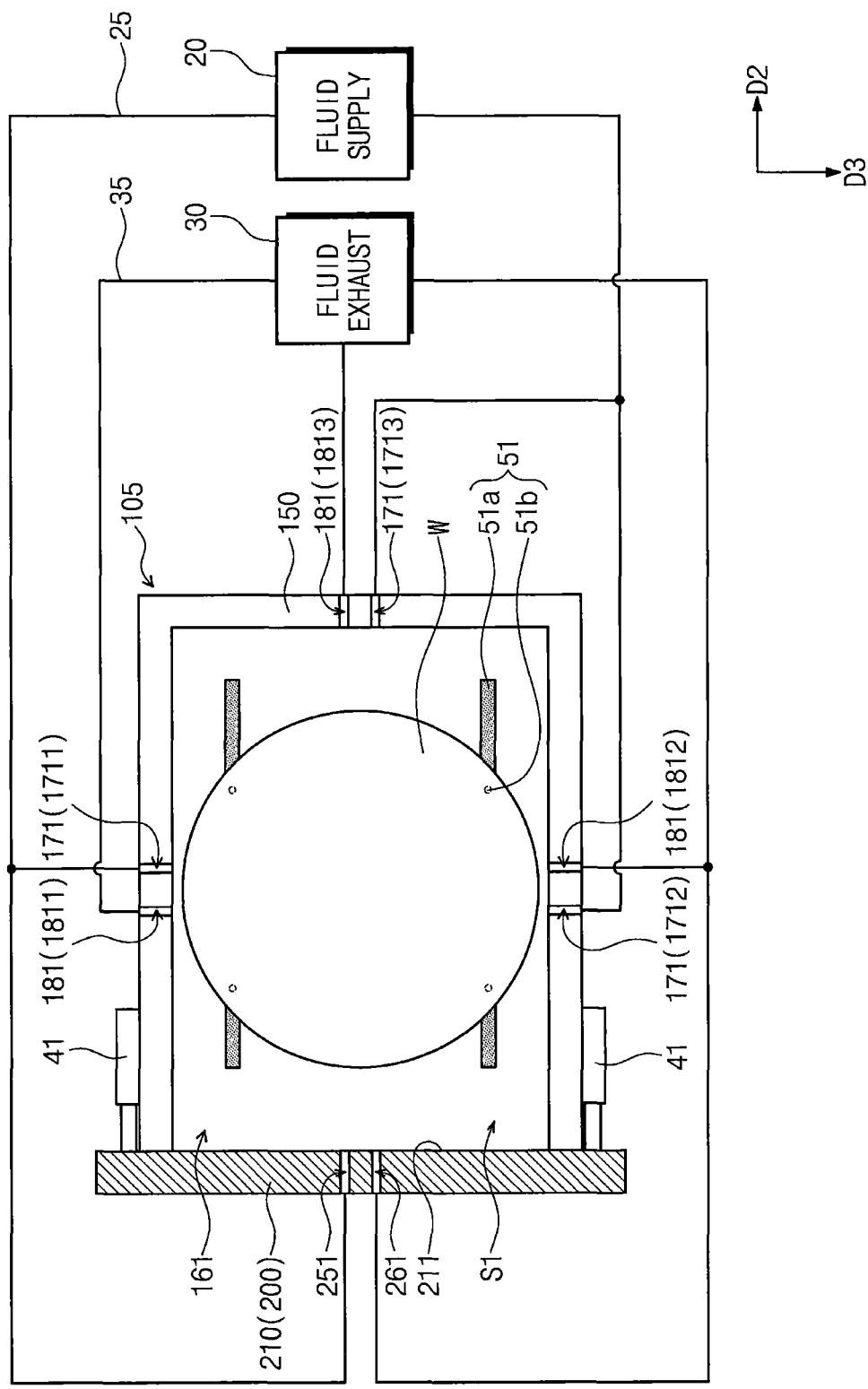
FIG. 12 illustrates a simplified cross sectional view showing an example of a process chamber of FIG. 11.
Figure 13:
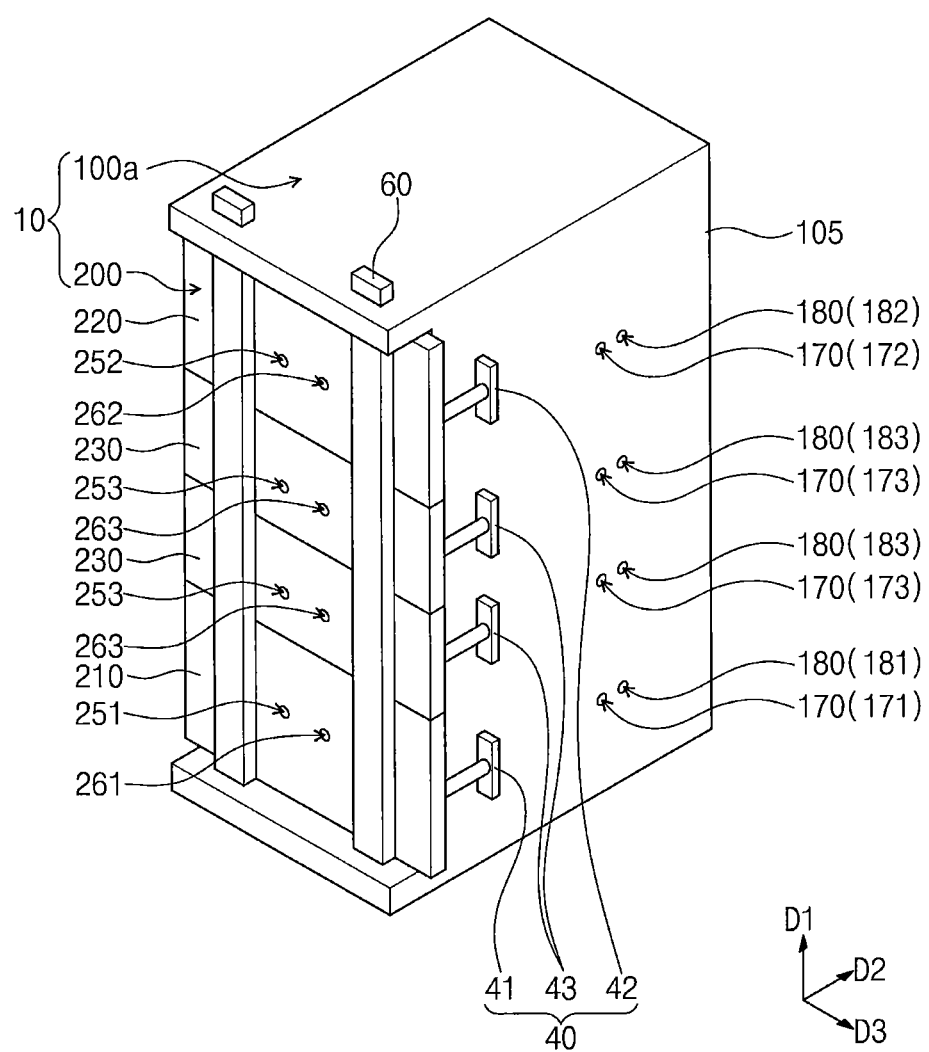
FIG. 13 illustrates a simplified perspective view showing a process chamber, a door unit, and a fixing member of FIG. 11.

FIG. 11 illustrates a simplified longitudinal sectional view showing an example of the substrate processing apparatus according to example embodiments of the present inventive concepts. FIG. 12 illustrates a simplified cross sectional view showing an example of the process chamber of FIG. 11. FIG. 13 illustrates a simplified perspective view showing a process chamber, a door unit, and a fixing member of FIG. 11. For brevity of description, components substantially the same as those of the embodiments discussed with reference to FIGS. 1 to 7 are omitted or abbreviated.

Referring to FIGS. 11 to 13, a substrate processing apparatus 1 according to example embodiments of the present inventive concepts may include a process chamber 10, a fluid supply 20, a fluid exhaust 30, a door unit (see 40 of FIG. 1), a fixing member 60, a substrate support 50, and a controller (see 70 of FIG. 2). The process chamber 10 may include a housing assembly 100a and a shield assembly 200.

The housing assembly 100a may include a housing body 105 and at least one partition wall 130 (which may be integrated with the housing body 105 in some embodiments). Unlike the housing assembly 100 of FIG. 4, the housing assembly 100a may include a single housing body 105. The housing assembly 100a may include supply holes or passageways 170, exhaust holes or passageways 180, and lower supply holes or passageways 175, all of which penetrate the housing body 105.

The housing body 105 may have an inner space. The housing body 105 may include a first outer wall 110, a second outer wall 120, and a side wall 150. The first outer wall 110 may be positioned below the partition wall 130. The second outer wall 120 may be positioned above the partition wall 130. The second outer wall 120 may be spaced apart in a first direction D1 from the first outer wall 110. The side wall 150 may connect the first and second outer walls 110 and 120 to each other.

The partition wall 130 may be positioned in the housing body 105. The partition wall 130 may be positioned between the first and second outer walls 110 and 120. The partition wall 130 may be spaced apart from the first and second outer walls 110 and 120. The partition wall 130 may divide the inner space of the housing body 105 into a plurality of compartment spaces S1, S2, and S3. A plurality of the partition walls 130 may be provided. In an embodiment, the partition wall 130 may include a first partition wall 136 closer to the first outer wall 110, a second partition wall 137 closer to the second outer wall 120, and a third partition wall 138 between the first and second partition walls 136 and 137. In an embodiment, a single third partition wall 138 may be provided. In other embodiments, a plurality of the third partition walls 138 may be provided, and the plurality of third partition walls 138 may be spaced apart from each other along the first direction D1. In certain embodiments, the housing assembly 100a may include only the first partition wall 136, or only the first and second partition walls 136 and 137.

In an embodiment, the first outer wall 110, the first partition wall 136, and the side wall 150 may form or define a first compartment space S1. The second outer wall 120, the second partition wall 137, and the side wall 150 may form or define a second compartment space S2. The first partition wall 136, the third partition wall 138, and the side wall 150 may form or define one third compartment space S3 (referred to hereinafter as a lower space). The second partition wall 137, the third partition wall 138, and the side wall 150 may form or define another third compartment space S3 (referred to hereinafter as an upper space). The first compartment space S1 may be a lowermost one of the compartment spaces S1, S2, and S3. The second compartment space S2 may be an uppermost one of the compartment spaces S1, S2, and S3. The third compartment spaces S3 may be positioned between the first and second compartment spaces S1 and S2. For example, each of the third compartment spaces S3 may be positioned between the first and second partition walls 136 and 137. The lower space S3 may be positioned below the upper space S3.

The supply holes 170 may include first, second, and third supply holes or passageways 171, 172, and 173, which are provided in or on the side wall 150. The exhaust holes 180 may include first, second, and third exhaust holes or passageways 181, 182, and 183, which are provided in or on the side wall 150. Each of the first to third supply holes 171, 172, and 173 may be connected to one of the compartment spaces S1, S2, and S3. Each of the first to third exhaust holes 181, 182, and 183 may be connected to one of the compartment spaces S1, S2, and S3. Each of the first to third supply holes 171, 172, and 173 may be provided in plural along a circumference of the side wall 150. Each of the first to third exhaust holes 181, 182, and 183 may be provided in plural along the circumference of the side wall 150.

The first supply holes 171 may surround the first compartment space S1. A fluid may be provided through the first supply holes 171 into the first compartment space S1. The first supply holes 171 may be spaced apart from each other.

The first exhaust holes 181 may surround the first compartment space S1. A fluid may be discharged through the first exhaust holes 181 from the first compartment space S1. The first exhaust holes 181 may be spaced apart from each other. One of the first exhaust holes 181 may face one of the first supply holes 171. In this description, the phrase "holes (e.g., exhaust holes, supply holes, sub-supply holes, etc.) may face each other" may mean that the holes are positioned on surfaces facing each other or on an imaginary line parallel to one of first, second, and third directions D1, D2, and D3. Put another way, one of the first exhaust holes 181 may be aligned with one of the first supply holes 171.

In an embodiment, the first supply holes 171 may include a one-side supply hole 1711 (referred to hereinafter as a left supply hole) and an opposite-side supply hole 1712 (referred to hereinafter as a right supply hole) spaced apart in the third direction D3 from the left supply hole 1711. The first exhaust holes 181 may include a one-side exhaust hole 1811 (referred to hereinafter as a left exhaust hole) and an opposite-side exhaust hole 1812 (referred to hereinafter as a right exhaust hole) spaced apart in the third direction D3 from the left exhaust hole 1811. The left supply hole 1711 may face or be aligned with the right exhaust hole 1812. For example, the left supply hole 1711 and the right exhaust hole 1812 may be positioned on a first imaginary line parallel to the third direction D3. The right supply hole 1712 and the left exhaust hole 1811 may be positioned on a second imaginary line parallel to the third direction D3. The first exhaust holes 181 may be positioned correspondingly close to the first supply holes 171. For example, the left supply hole 1711 and the left exhaust hole 1811 may be positioned adjacent each other.

The second supply holes 172 may surround the second compartment space S2. A fluid may be supplied through the second supply holes 172 into the second compartment space S2. The second supply holes 172 may be spaced apart from each other. The second exhaust holes 182 may surround the second compartment space S2. A fluid may be discharged through the second exhaust holes 182 from the second compartment space S2. The second exhaust holes 182 may be spaced apart from each other. One of the second exhaust holes 182 may face or be aligned with one of the second supply holes 172. The second exhaust holes 182 may be positioned correspondingly close to the second supply holes 172.

The third supply holes 173 may surround the third compartment space S3. A fluid may be supplied through the third supply holes 173 into the third compartment space S3. The third supply holes 173 may be spaced apart from each other. The third exhaust holes 183 may surround the third compartment space S3. A fluid may be discharged through the third exhaust holes 183 from the third compartment space S3. The third exhaust holes 183 may be positioned correspondingly close to the third supply holes 173. One of the third exhaust holes 183 may face or be aligned with one of the third supply holes 173. The side wall 150 may include a plurality of entrances 160 penetrating therethrough. In an embodiment, the side wall 150 may include a first entrance 161 connected to the first compartment space S1, a second entrance 162 connected to the second compartment space S2, and at least one third entrance 163 connected to the third compartment space S3.

The shield assembly 200 may include first, second, and third shield members 210, 220, and 230. The shield assembly 200 may include a first sub-supply hole or passageway 251, a first sub-exhaust hole or passageway 261, a second sub-supply hole or passageway 252, a second sub-exhaust hole or passageway 262, a third sub-supply hole or passageway 253, and a third sub-exhaust hole or passageway 263. The first sub-supply hole 251 and the first sub-exhaust hole 261 may penetrate the first shield member 210 and may be positioned adjacent each other. The second sub-supply hole 252 and the second sub-exhaust hole 262 may penetrate the second shield member 220 and may be positioned adjacent each other. The third sub-supply hole 253 and the third sub-exhaust hole 263 may penetrate the third shield member 230 and may be positioned adjacent each other. The first to third sub-supply holes 251, 252, and 253 may be connected to the fluid supply 20. The first to third sub-exhaust holes 261, 262, and 263 may be connected to the fluid exhaust 30.

The first sub-supply hole 251 may face or be aligned with another one of the first exhaust holes 181. In an embodiment, the first exhaust hole 181 facing the first sub-supply hole 251 may also be called a rear exhaust hole 1813. The first sub-exhaust hole 261 may face or be aligned with another one of the first supply holes 171. In an embodiment, the first supply hole 171 facing the first sub-exhaust hole 261 may also be called a rear supply hole 1713. The rear exhaust hole 1813 and the rear supply hole 1713 may be positioned adjacent each other. The second sub-supply hole 252 may face or be aligned with another one of the second exhaust holes 182. The second sub-exhaust hole 262 may face or be aligned with another one of the second supply holes 172. The third sub-supply hole 253 may face or be aligned with another one of the third exhaust holes 183. The third sub-exhaust hole 263 may face or be aligned with another one of the third supply holes 173.

The substrate support 50 may be installed on the housing assembly 100a (see FIG. 4). The substrate support 50 may include first, second, and third substrate support members 51, 52, and 53 (see FIG. 4). The first substrate support member 51 may be positioned in the first compartment space S1. The second substrate support member 52 may be positioned in the second compartment space S2. The third substrate support member 53 may be positioned in the third compartment space S3. The first to third substrate support members 51, 52, and 53 may be identically configured to each other. Hereinafter, the first substrate support member 51 will be mainly described below.

The first substrate support member 51 may include first horizontal rods 51a and first vertical rods 51c. The first vertical rods 51c may extend from the first partition wall 136 toward the first outer wall 110. The first vertical rods 51c may connect the first partition wall 136 and the first horizontal rods 51a to each other. For example, the first vertical rods 51c may have top ends coupled to the first partition wall 136 and bottom ends coupled to the first horizontal rods 51a.

FIGS. 14 to 19 illustrate simplified cross sectional views showing fluid communication in the process chamber of FIG. 11. FIGS. 14 to 19 show that the fluid supply 20 supplies a fluid to the first compartment space S1 and the fluid exhaust 30 may discharge a fluid from the first compartment space S1. FIGS. 14 to 19 correspond to FIG. 12, but omit the fluid supply 20 and the fluid exhaust 30 of FIG. 12.

Figure 14:
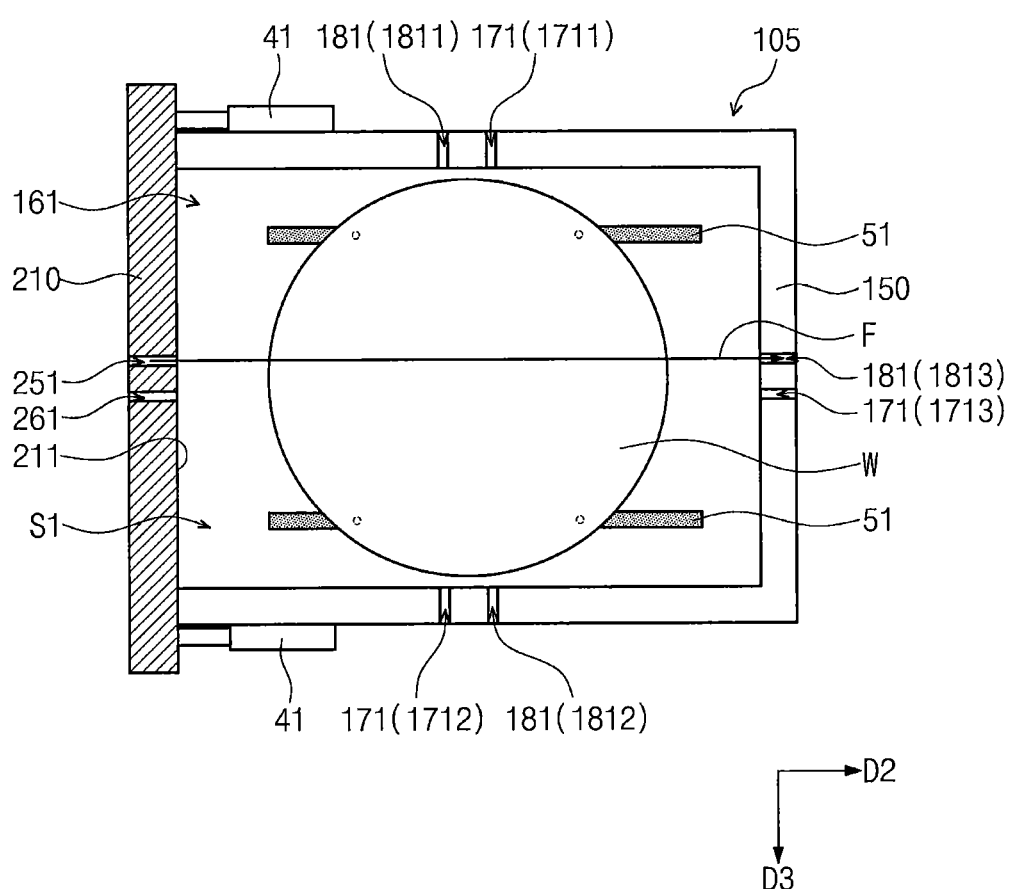
FIGS. 14 to 19 illustrate simplified cross sectional views showing fluid communication in a process chamber of FIG. 11.

Referring to FIG. 14, the fluid supply 20 may supply a supercritical fluid F through the first sub-supply hole 251 to the first compartment space S1. The fluid exhaust 30 may discharge the supercritical fluid F from the first compartment space S1 through the rear exhaust hole 1813 facing the first sub-supply hole 251. Accordingly, the supercritical fluid F supplied to the first compartment space S1 may be discharged through the rear exhaust hole 1813. For example, the supercritical fluid F may flow along the second direction D2.

Figure 15:
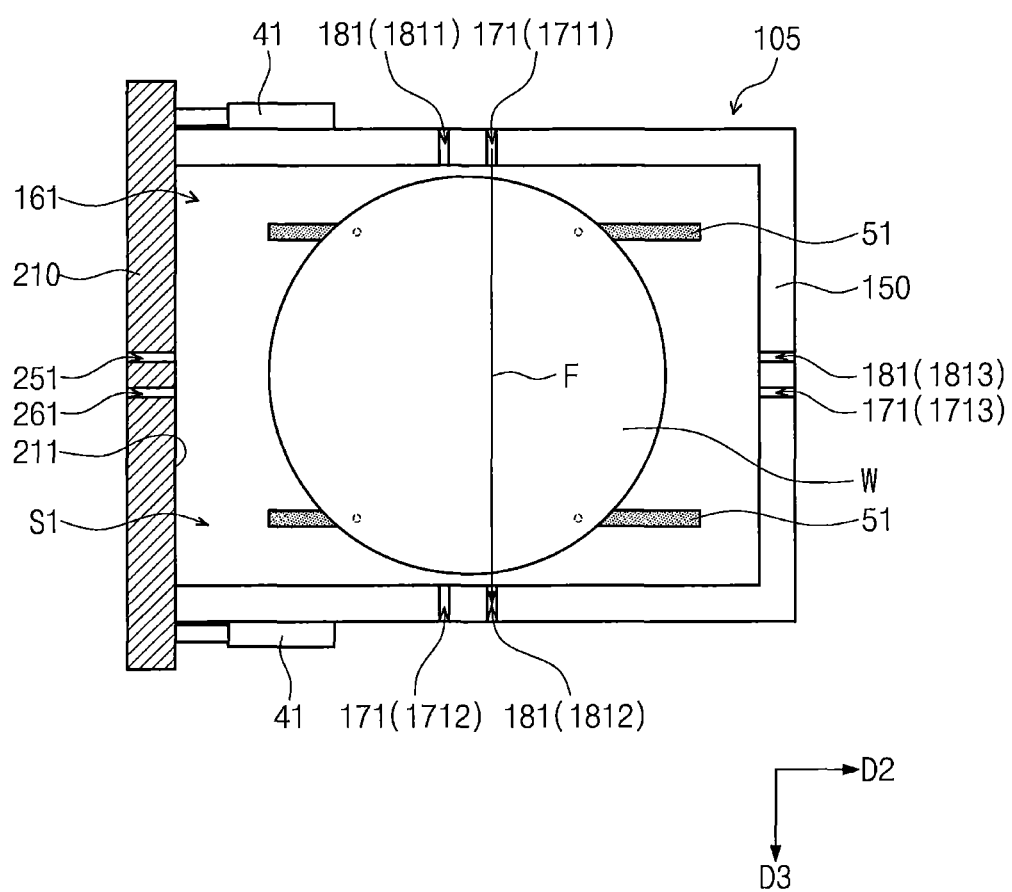

Referring to FIG. 15, the fluid supply 20 may supply the supercritical fluid F through the left supply hole 1711 to the first compartment space S1. The fluid exhaust 30 may discharge the supercritical fluid F through the right exhaust hole 1812 from the first compartment space S1. For example, the supercritical fluid F may flow along the third direction D3.

The flow of the supercritical fluid F shown in FIGS. 14 and 15 may generate a vortex in the first compartment space S1. In this case, the supercritical fluid F may not be uniformly provided onto the substrate W.

Figure 16:
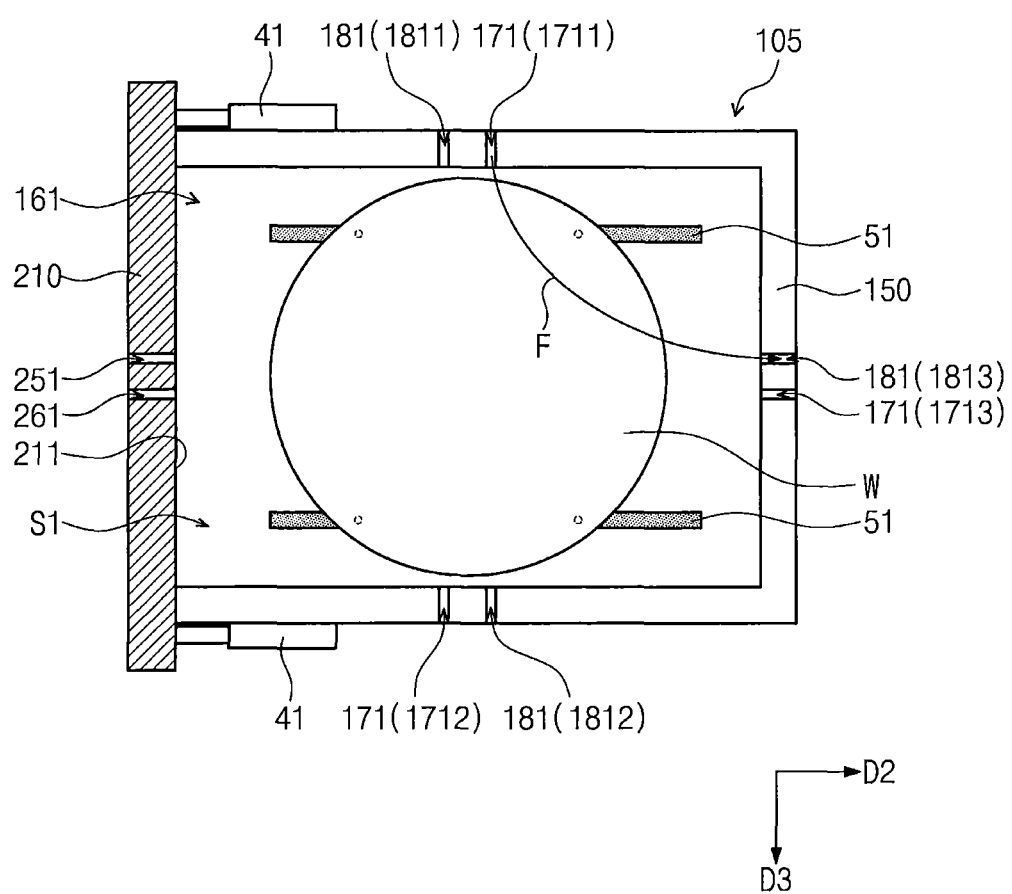

Referring to FIG. 16, the fluid supply 20 may supply the supercritical fluid F through the left supply hole 1711 to the first compartment space S1. The fluid exhaust 30 may discharge the supercritical fluid F through the rear exhaust hole 1813 from the first compartment space S1.

Figure 17:
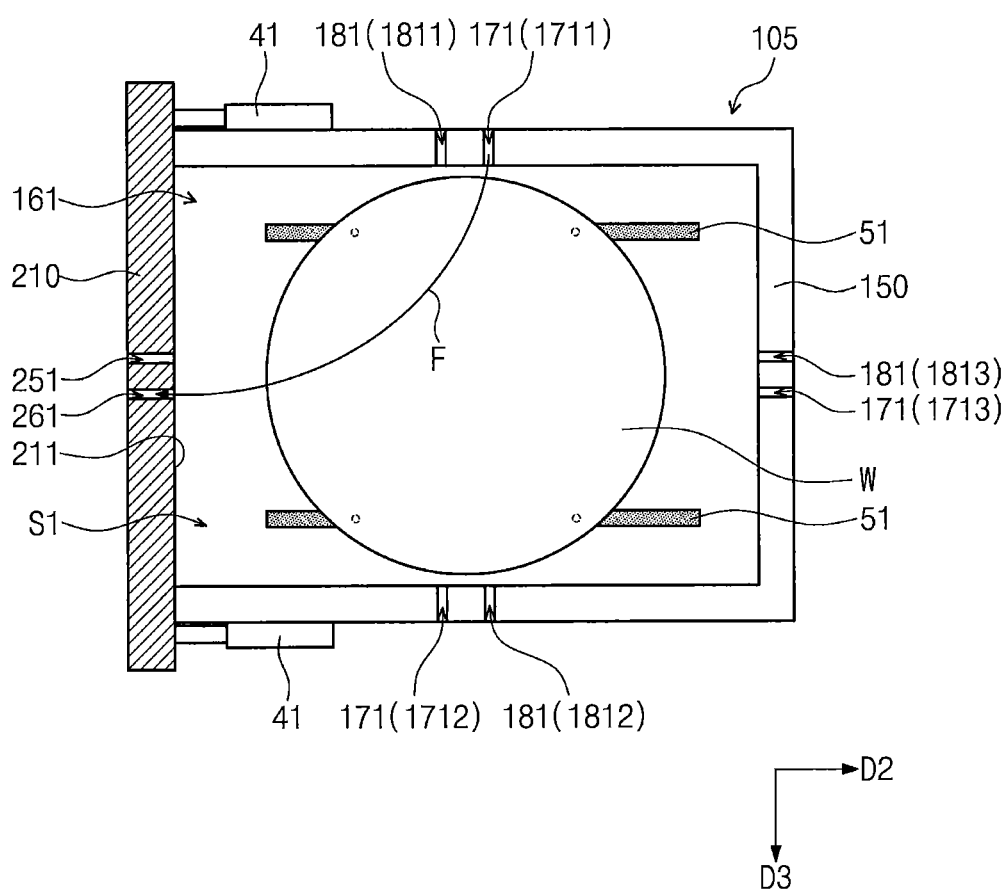

Referring to FIG. 17, the fluid supply 20 may supply the supercritical fluid F through the left supply hole 1711 to the first compartment space S1. The fluid exhaust 30 may discharge the supercritical fluid F through the first sub-exhaust hole 261 from the first compartment space S1.

Figure 18:
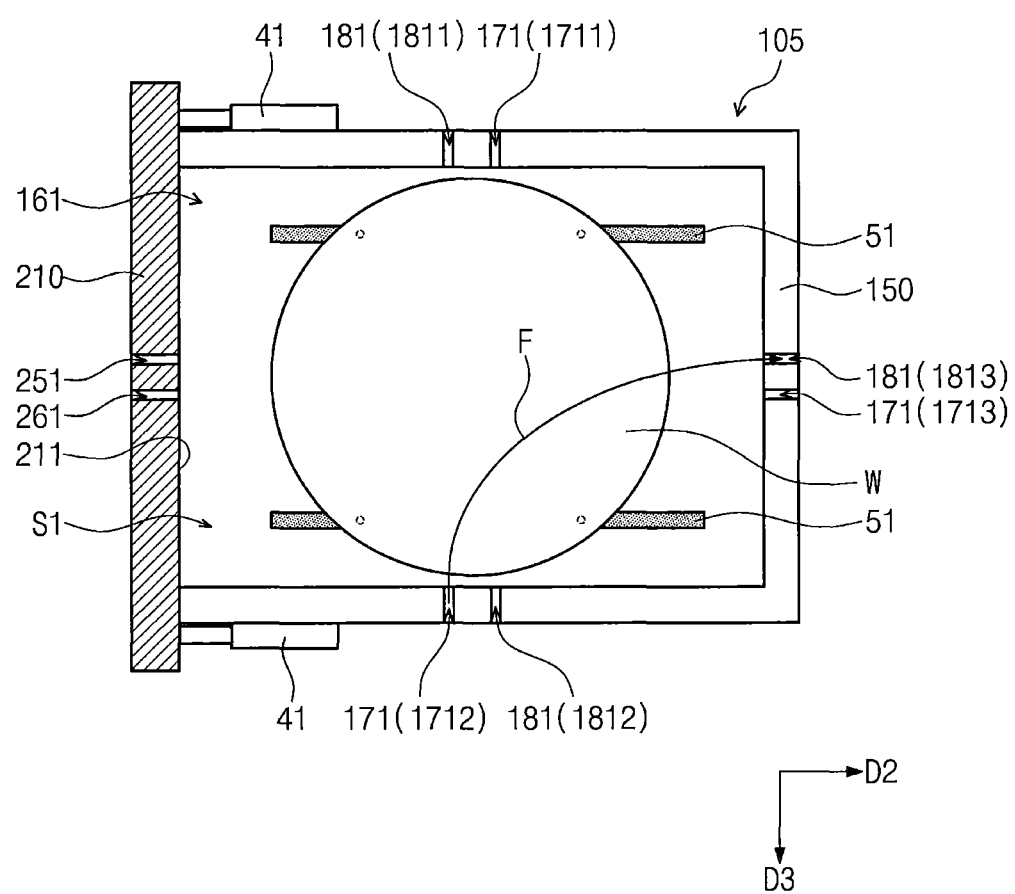

Referring to FIG. 18, the fluid supply 20 may supply the supercritical fluid F through the right supply hole 1712 to the first compartment space S1. The fluid exhaust 30 may discharge the supercritical fluid F through the rear exhaust hole 1813 from the first compartment space S1.

Figure 19:
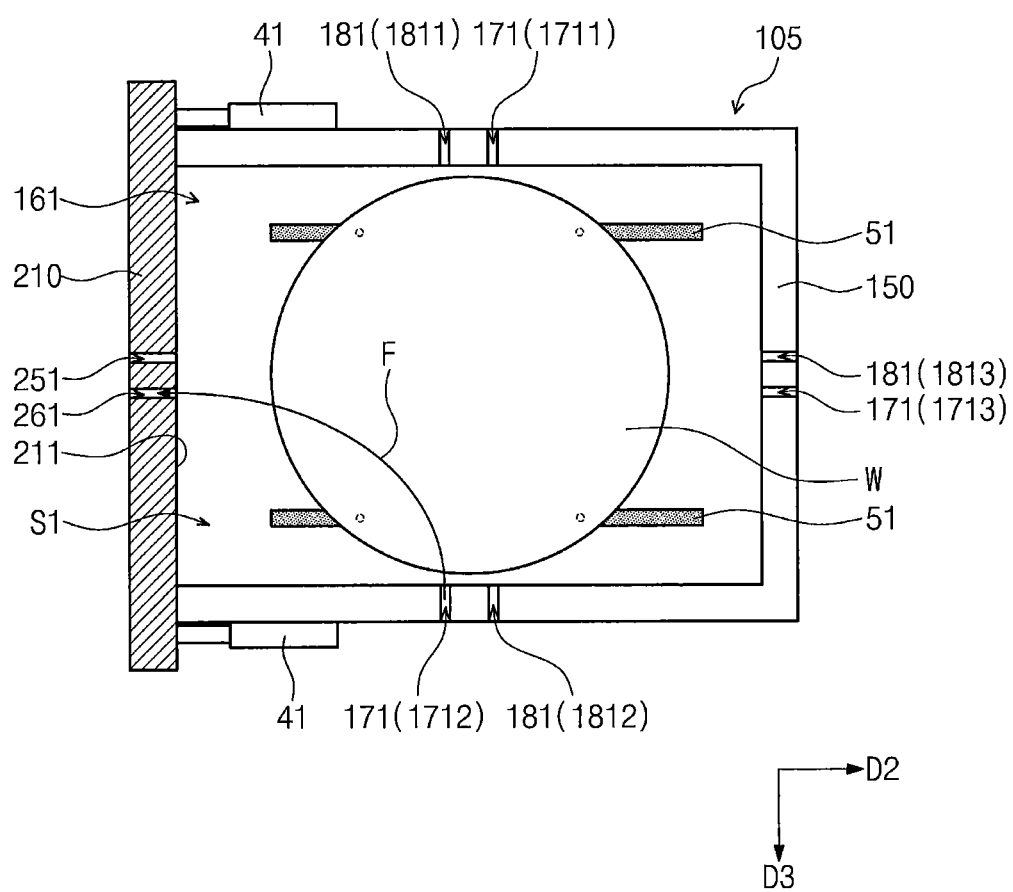

Referring to FIG. 19, the fluid supply 20 may supply the supercritical fluid F through the right supply hole 1712 to the first compartment space S1. The fluid exhaust 30 may discharge the supercritical fluid F through the first sub-exhaust hole 261 from the first compartment space S1.

The vortex may also be generated even the flow of the supercritical fluid shown in FIGS. 16 to 19. Nevertheless, as illustrated in FIGS. 12 to 19, the supercritical fluid F may flow in various directions, and may thus be uniformly provided onto the entirety of the substrate W. Accordingly, a uniform drying process may be performed on the entirety of the substrate W.

Identically or similarly to the fluid supply to the first compartment space S1, the fluid supply 20 may supply the supercritical fluid F to the second and third compartment spaces S2 and S3. Identically or similarly to the fluid discharge from the first compartment space S1, the fluid exhaust 30 may discharge the supercritical fluid F from the second and third compartment spaces S2 and S3.

The fluid supply 20 may supply the supercritical fluid F to the first to third compartment spaces S1, S2, and S3 along flow paths different from those of the supercritical fluid F shown in FIGS. 14 to 19, and likewise the fluid exhaust 30 may discharge the supercritical fluid F from the first to third compartment spaces S1, S2, and S3 along flow paths different from those of the supercritical fluid F shown in FIGS. 14 to 19.

Figure 20:
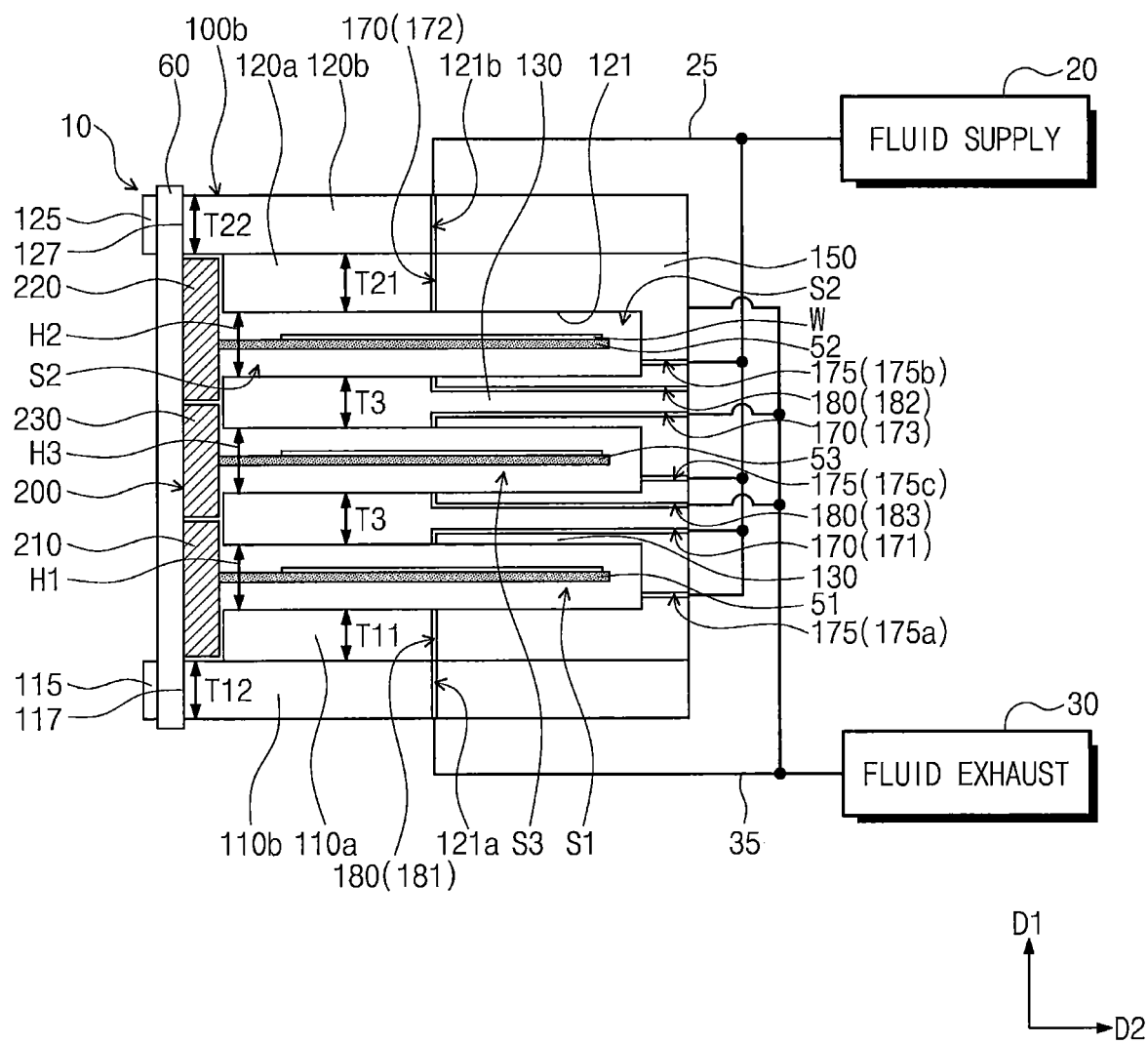
FIG. 20 illustrates a simplified longitudinal sectional view showing an example of the substrate processing apparatus according to example embodiments of the present inventive concepts.

FIG. 20 illustrates a simplified longitudinal sectional view showing an example of the substrate processing apparatus according to example embodiments of the present inventive concepts. For brevity of description, components substantially the same as those of the embodiments discussed with reference to FIGS. 1 to 7 and 11 to 13 may be omitted or abbreviated.

Referring to FIG. 20, a substrate processing apparatus 1 may include a process chamber 10, a fluid supply 20, a fluid exhaust 30, a door unit (see 40 of FIG. 1), a fixing member 60, a substrate support 50, and a controller (see 70 of FIG. 2).

The process chamber 10 may include a housing assembly 100b and a shield assembly 200. The housing assembly 100b may include a housing body 105, a partition wall 130, a first support wall 110b, and a second support wall 120b. The housing assembly 100b may include a plurality of supply holes or passageways 170 penetrating therethrough and a plurality of exhaust holes or passageways 180 penetrating therethrough. The housing body 105 may include a lower wall 110a, an upper wall 120a, and a side wall 150. The housing body 105 of FIG. 20 may be configured similar to the housing body 105 of FIG. 11.

The lower wall 110a and the upper wall 120a may be spaced apart from each other. The lower wall 110a and the upper wall 120a may be positioned between the first support wall 110b and the second support wall 120b. The side wall 150 may connect the lower wall 110a and the upper wall 120a to each other. The lower wall 110a, the upper wall 120a, and the partition wall 130 may respectively have thicknesses T11, T21, and T3 that are approximately the same as each other, but are not limited thereto.

The first support wall 110b may be positioned below the lower wall 110a. The first support wall 110b may be in contact with a bottom surface of the lower wall 110a. The first support wall 110b may correspond to the lower wall 110a. The second support wall 120b may be positioned above the upper wall 120a. The second support wall 120b may be in contact with a top surface of the upper wall 120a. The second support wall 120b may correspond to the upper wall 120a. The first and second support walls 110b and 120b may respectively have thicknesses T12 and T22 greater than the thickness T3 of the partition wall 130.

The thickness T3 of the partition wall 130 may be less than a sum of the thickness T12 of the first support wall 110b and the thickness T11 of the lower wall 110a. The thickness T3 of the partition wall 130 may be less than a sum of the thickness T22 of the second support wall 120b and the thickness T21 of the upper wall 120a. The sum of the thicknesses T12 and T11 of the first support wall 110b and the lower wall 110a and the sum of the thicknesses T22 and T21 of the second support wall 120b and the upper wall 120a may be selected to endure a pressure equal to or above the critical pressure of the supercritical fluid.

A first exhaust hole or passageway 181 may be provided in or on the lower wall 110a. The first exhaust hole 181 may penetrate the lower wall 110a. A second supply hole or passageway 172 may be provided in or on the upper wall 120a. The second supply hole 172 may penetrate the upper wall 120a.

The first support wall 110b may include a first connect hole or passageway 121a penetrating therethrough. The first connect hole 121a may be connected to the first exhaust hole 181. The first connect hole 121a and the first exhaust hole 181 may vertically overlap or align with each other. The first connect hole 121a may be connected to the fluid exhaust 30. The second support wall 120b may include a second connect hole or passageway 121b penetrating therethrough. The second connect hole 121b may be connected to the second supply hole 172. The second connect hole 121b and the second supply hole 172 may vertically overlap or align with each other. The second connect hole 121b may be connected to the fluid supply 20.

The structural features of the process chamber 10 of FIG. 4 may be applicable to the process chamber 10 of FIG. 11. The structural features of the process chamber 10 of FIG. 11 may be applicable to the process chamber 10 of FIGS. 4 and 20. The structural features of the process chamber 10 of FIG. 20 may be applicable to the process chamber 10 of FIGS. 4 and 11.

Figure 21:
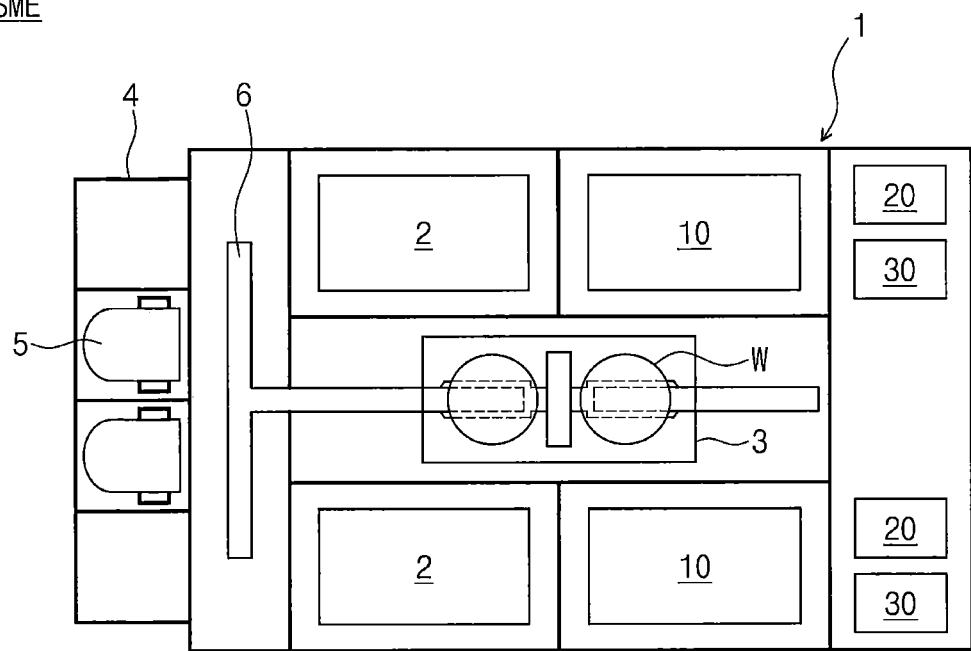
FIG. 21 illustrates a schematic diagram showing a semiconductor manufacturing facility including a substrate processing apparatus according to example embodiments of the present inventive concepts.

FIG. 21 illustrates a schematic diagram showing a semiconductor manufacturing facility including a substrate processing apparatus according to example embodiments of the present inventive concepts.

Referring to FIG. 21, a semiconductor manufacturing facility SME may be provided with the substrate processing apparatus 1 according to the example embodiments of the present inventive concept, but it is not limited thereto. For example, the semiconductor manufacturing facility SME may include a wet process system. The semiconductor manufacturing facility SME may include, for example, the substrate processing apparatus 1, a first process chamber 2, and a substrate transfer apparatus 3.

The substrate processing apparatus 1 may include a second process chamber 10, a fluid supply 20, and a fluid exhaust 30. The substrate processing apparatus 1 may further include a door unit (see 40 of FIG. 2), a fixing member (see 60 of FIG. 3), and a controller (see 70 of FIG. 2).

The first and second process chambers 2 and 10 may be disposed adjacent to each other. In an embodiment, the first process chamber 2 may be provided on one side of the second process chamber 10, and the fluid supply 20 and the fluid exhaust 30 may be provided on other side of the second process chamber 10. The first process chamber 2 may be adjacent to load ports 4. An arrangement of the first and second process chambers 2 and 10 may be not limited to the aforementioned, and may be variously modified in consideration of processing efficiency.

Each of the first and second process chambers 2 and 10 may be provided in plural. The second process chamber 10, the fluid supply 20, and the fluid exhaust 30 may respectively correspond to the process chamber 10, the fluid supply 20, and the fluid exhaust 30 of the substrate processing apparatus 1 discussed with reference to FIGS. 1 to 20.

The first and second process chambers 2 and 10 may perform different processes on a substrate W. In an embodiment, first and second processes respectively performed in the first and second process chambers 2 and 10 may be sequential processes, but are not limited thereto. In an embodiment, the first process chamber 2 may perform a chemical process, a cleaning process, and a first drying process. The second process chamber 10 may perform a second drying process that is preceded by the first drying process. The first drying process may be a wet drying process using an organic solvent, and the second drying process may be a supercritical drying process using a supercritical fluid. The first drying process may not be performed under different circumstances.

The substrate transfer apparatus 3 may move along a guide rail 6, and may transfer the substrates W to the substrate processing apparatus 1 and the first process chamber 2. For example, the substrate transfer apparatus 3 may transfer the substrates W to the first process chamber 2 and the second process chamber 10. The substrate transfer apparatus 3 may load/unload the substrates W on/from carriers 5 on the load ports 4.

According to example embodiments of the present inventive concepts, the process chamber may include a plurality of compartment spaces in each of which a substrate treating process is performed. The process chamber may become compact-sized. The substrate treating process may increase in processing efficiency.

Effects of the present inventive concepts are not limited to the above-mentioned ones, and other effects which have not been mentioned above will be clearly understood to those skilled in the art from the following description.

Although the present inventive concepts have been described in connection with the embodiments of the present inventive concepts illustrated in the accompanying drawings, it will be understood by one of ordinary skill in the art that variations in form and detail may be made therein without departing from the spirit and essential features of the inventive concepts. The above disclosed embodiments should thus be considered illustrative and not restrictive.

What is claimed is:

1. A process chamber comprising:
   a first housing;
   a first substrate support member in the first housing;
   a second housing on the first housing;
   a second substrate support member in the second housing; and
   a fixing bar disposed beside the first and second housings,
   wherein the first housing comprises:
   a first bottom wall having a first insert hole receiving the fixing bar;
   a first top wall facing the first bottom wall;
   a first side wall connected between the first bottom wall and the first top wall and having a first opening to provide a substrate in the first housing; and
   a first sliding door disposed between the fixing bar and the first opening and configured to close and open the first opening, the first sliding door connected to the first support member, wherein the second housing comprises:
a second top wall having a second insert hole receiving the fixing bar;
a second bottom wall between the second top wall and the first top wall; and
a second side wall connected between the second top wall and the second bottom wall and having a second opening to provide the substrate in the second housing; and
a second sliding door disposed between the fixing bar and the second opening and configured to close and open the second opening, the second sliding door connected to the second support member,
wherein each of the first side wall and the second side wall have a right supply hole and a left supply hole disposed on both sides of the first and second substrate support member to provide a fluid in the first housing and the second housing,
wherein each of the first side wall and the second side wall have a right exhaust hole and left exhaust hole adjacent to the right supply hole and the left supply hole respectively to extract the fluid in the first housing and the second housing,
wherein the first and second sliding doors are provided in the first and second housing in a first direction, and
wherein the right supply hole, the left supply hole, the right exhaust hole, and the left exhaust hole extend in a second direction perpendicular to the first direction.

2. The process chamber of claim 1,
wherein the first housing further comprises:
at least one first supply passageway penetrating the first housing; and
at least one first exhaust passageway penetrating the first housing, and
the second housing further comprises:
at least one second supply passageway penetrating the second housing; and
at least one second exhaust passageway penetrating the second housing.

3. The process chamber of claim 2,
wherein the first top wall comprises:
a first wall surface facing the first bottom wall; and
a second wall surface facing the second bottom wall,
wherein the second bottom wall comprises:
a third wall surface facing the second wall surface; and
a fourth wall surface facing the second top wall,
wherein the at least one first exhaust passageway penetrates the first bottom wall,
wherein the at least one first supply passageway comprises:
a first supply flow path extending from the first wall surface toward the second wall surface; and
a second supply flow path extending from the first supply flow path toward the first side wall,
wherein the at least one second supply passageway penetrates the second top wall, and
wherein the at least one second exhaust passageway comprises:
a first exhaust flow path extending from the fourth wall surface toward the third wall surface; and
a second exhaust flow path extending from the first exhaust flow path toward the second side wall.

4. The process chamber of claim 3, wherein the first supply flow path, the first exhaust flow path, the at least one second supply passageway, and the at least one first exhaust passageway are vertically aligned with each other.

5. The process chamber of claim 2, wherein at least a portion of the at least one first supply passageway, at least a portion of the at least one first exhaust passageway, at least a portion of the at least one second supply passageway, and at least a portion of the at least one second exhaust passageway are vertically aligned with each other.

6. The process chamber of claim 2, wherein
the at least one first supply passageway comprises a plurality of first supply passageways provided along a circumference of the first side wall,
the at least one first exhaust passageway comprises a plurality of first exhaust passageways provided along the circumference of the first side wall,
the at least one second supply passageway comprises a plurality of second supply passageways provided along a circumference of the second side wall, and
the at least one second exhaust passageway comprises a plurality of second exhaust passageways provided along the circumference of the second side wall.

7. The process chamber of claim 6, wherein
one of the plurality of first exhaust passageways faces one of the plurality of first supply passageways, and
one of the plurality of second exhaust passageways faces one of the plurality of second supply passageways.

8. The process chamber of claim 7,
the first sliding door comprises a first sub-supply passageway penetrating the first sliding door
the second sliding door comprises a second sub-supply passageway penetrating the second sliding door,
wherein the first sub-supply passageway faces another one of the plurality of first exhaust passageways, and
wherein the second sub-supply passageway faces another one of the plurality of second exhaust passageways.

9. The process chamber of claim 1, further comprising at least one third housing between the first housing and the second housing,
wherein the at least one third housing comprises:
a third bottom wall;
a third top wall between the third bottom wall and the second housing; and
a third side wall connecting the third bottom wall and the third top wall.

10. The process chamber of claim 9, wherein the first top wall, the second bottom wall, the third bottom wall, and the third top wall each have the same thickness.

11. The process chamber of claim 9, wherein the at least one third housing further comprises:
at least one third supply passageway penetrating the at least one third housing; and
at least one third exhaust passageway penetrating the at least one third housing.

12. The process chamber of claim 11,
wherein the third bottom wall comprises:
a fifth wall surface facing the first housing; and
a sixth wall surface facing the third top wall,
wherein the at least one third exhaust passageway comprises:
a third exhaust flow path extending from the fifth wall surface toward the sixth wall surface; and
a fourth exhaust flow path extending from the third exhaust flow path toward the third side wall,
wherein the third top wall comprises:
a seventh wall surface facing the third bottom wall; and
an eighth wall surface facing the second housing, and
wherein the at least one third supply passageway comprises:

a third supply flow path extending from the seventh wall surface toward the eighth wall surface; and a fourth supply flow path extending from the third supply flow path toward the third side wall.

13. The process chamber of claim 11, wherein the at least one third supply passageway comprises a plurality of third supply passageways provided along a circumference of the third side wall, the at least one third exhaust passageway comprises a plurality of third exhaust passageways provided along the circumference of the third side wall.

14. The process chamber of claim 13, wherein one of the plurality of third supply passageways faces one of the plurality of third exhaust passageways.

15. The process chamber of claim 14, further comprising a third sliding door disposed between the fixing bar and a third opening defined in the third side wall and configured to close and open the third opening, wherein the third sliding door comprises a third sub-supply passageway configured to supply a fluid into the at least one third housing, wherein the third sub-supply passageway faces another one of the plurality of third exhaust passageways.

16. The process chamber of claim 1, wherein the first bottom wall and the first top wall are spaced apart from each other at a spacing distance less than the thickness of the first bottom wall and greater than the thickness of the first top wall, and the second top wall and the second bottom wall are spaced apart from each other at a spacing distance less than the thickness of the second top wall and greater than the thickness of the second bottom wall.

17. A substrate processing apparatus comprising:

a process chamber comprising a first housing having a first inner space and a second housing having a second inner space, the second housing being stacked on the first housing;

a first substrate support member in the first inner space and configured to support a substrate;

a second substrate support member in the second inner space and configured to support a substrate;

a fluid supply configured to supply a fluid into the first and second inner spaces;

a fluid exhaust configured to exhaust the fluid from the first and second inner spaces; and a fixing bar disposed beside the first and second housings, wherein the first housing comprises:

a first bottom wall having a first insert hole receiving the fixing bar;

a first top wall facing the first bottom wall;

a first side wall connecting the first bottom wall and the first top wall and having a first opening to provide a substrate in the first housing; and a first sliding door disposed between the fixing bar and the first opening and configured to close and open the first opening, the first sliding door connected to the first support member, wherein the second housing comprises:

a second top wall having a second insert hole receiving the fixing bar;

a second bottom wall between the second top wall and the first top wall;

a second side wall connecting the second top wall and the second bottom wall and having a second opening to provide the substrate in the second housing; and a second sliding door disposed between the fixing bar and the second opening and configured to close and open the second opening, the second sliding door connected to the second support member, wherein each of the first side wall and the second side wall have a right supply hole and a left supply hole disposed on both sides of the first and second substrate support member to provide a fluid in the first housing and the second housing, wherein each of the first side wall and the second side wall have a right exhaust hole and left exhaust hole adjacent to the right supply hole and the left supply hole respectively to extract the fluid in the first housing and the second housing, wherein the first and second sliding doors are provided in the first and second housing in a first direction, and wherein the right supply hole, the left supply hole, the right exhaust hole, and the left exhaust hole extend in a second direction perpendicular to the first direction.

18. The substrate processing apparatus of claim 17, wherein the first housing further comprises:

at least one first supply passageway penetrating the first housing and connected to the fluid supply; and at least one first exhaust passageway penetrating the first housing and connected to the fluid exhaust, and wherein the second housing further comprises:

at least one second supply passageway penetrating the second housing and connected to the fluid supply; and at least one second exhaust passageway penetrating the second housing and connected to the fluid exhaust.

19. The substrate processing apparatus of claim 18, wherein at least a portion of the at least one first supply passageway, at least a portion of the at least one first exhaust passageway, at least a portion of the at least one second supply passageway, and at least a portion of the at least one second exhaust passageway are vertically aligned with each other.

20. The substrate processing apparatus of claim 17, further comprising at least one third housing between the first housing and the second housing, wherein the at least one third housing comprises:

a third bottom wall;

a third top wall between the third bottom wall and the second housing; and a third side wall connecting the third top wall and the third bottom wall.

* * * * *